US009997486B2

(12) United States Patent
Akutsu et al.

(10) Patent No.: US 9,997,486 B2
(45) Date of Patent: Jun. 12, 2018

(54) ANISOTROPIC CONDUCTIVE FILM INCLUDING OBLIQUE REGION HAVING LOWER CURING RATIO

(71) Applicant: DEXERIALS CORPORATION, Tokyo (JP)

(72) Inventors: Yasushi Akutsu, Utsunomiya (JP); Reiji Tsukao, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days. days.

(21) Appl. No.: 15/115,827

(22) PCT Filed: Feb. 3, 2015

(86) PCT No.: PCT/JP2015/052910
§ 371 (c)(1),
(2) Date: Aug. 1, 2016

(87) PCT Pub. No.: WO2015/119090
PCT Pub. Date: Aug. 13, 2015

(65) Prior Publication Data

US 2017/0077055 A1 Mar. 16, 2017

(30) Foreign Application Priority Data

Feb. 4, 2014 (JP) ................................ 2014-019864
Feb. 4, 2014 (JP) ................................ 2014-019865

(51) Int. Cl.
*H01L 23/48* (2006.01)
*H01L 23/52* (2006.01)
(Continued)

(52) U.S. Cl.
CPC .............. *H01L 24/29* (2013.01); *B32B 27/08* (2013.01); *B32B 27/14* (2013.01); *B32B 27/18* (2013.01);
(Continued)

(58) Field of Classification Search
CPC ................................ B32B 27/08; B32B 27/14
See application file for complete search history.

(56) References Cited

U.S. PATENT DOCUMENTS

2006/0280912 A1* 12/2006 Liang ........................ H01B 1/22 428/173
2009/0239082 A1* 9/2009 Fujita ..................... H05K 3/323 428/413
2016/0155717 A1* 6/2016 Saruyama ................ H01R 4/04 428/156

FOREIGN PATENT DOCUMENTS

CN 101601171 A 12/2009
JP 2001-052778 A 2/2001
(Continued)

OTHER PUBLICATIONS

May 12, 2015 International Search Report issued in International Patent Application No. PCT/JP2015/052910.
(Continued)

*Primary Examiner* — Matthew Gordon
(74) *Attorney, Agent, or Firm* — Oliff PLC

(57) ABSTRACT

An anisotropic conductive film has a first connection layer and a second connection layer formed on surface of the first connection layer. The first connection layer is a photopolymerized resin layer, and the second connection layer is a thermo- or photo-cationically, anionically, or radically polymerizable resin layer. On the surface of first connection layer on the side of second connection layer, conductive particles for anisotropic conductive connection are arranged in a single layer. A region in which the curing ratio is lower than that of the surface of the first connection layer exists in a direction oblique to the thickness direction of the first connection layer. Alternatively, the curing ratio of a region relatively near another surface of the first connection layer among regions of the first connection layer in the vicinity of
(Continued)

the conductive particles is lower than that of the surface of the first connection layer.

16 Claims, 14 Drawing Sheets

(51) Int. Cl.

| | |
|---|---|
| ***H01L 29/40*** | (2006.01) |
| ***H01L 23/00*** | (2006.01) |
| ***B32B 27/18*** | (2006.01) |
| ***C09J 4/00*** | (2006.01) |
| ***C09J 7/00*** | (2018.01) |
| ***C09J 9/02*** | (2006.01) |
| ***C09J 163/00*** | (2006.01) |
| ***C09J 201/00*** | (2006.01) |
| ***H01B 1/02*** | (2006.01) |
| ***C08F 220/18*** | (2006.01) |
| ***B32B 27/08*** | (2006.01) |
| ***B32B 27/20*** | (2006.01) |
| ***B32B 27/38*** | (2006.01) |
| ***B32B 27/14*** | (2006.01) |
| *H01R 4/04* | (2006.01) |
| *H05K 3/32* | (2006.01) |

(52) U.S. Cl.

CPC .............. *B32B 27/20* (2013.01); *B32B 27/38* (2013.01); *C08F 220/18* (2013.01); *C09J 4/00* (2013.01); *C09J 7/00* (2013.01); *C09J 9/02* (2013.01); *C09J 163/00* (2013.01); *C09J 201/00* (2013.01); *H01B 1/02* (2013.01); *H01L 24/27* (2013.01); *H01L 24/32* (2013.01); *H01L 24/81* (2013.01); *H01L 24/83* (2013.01); *B32B 2307/202* (2013.01); *B32B 2457/00* (2013.01); *C08K 2201/001* (2013.01); *C09J 2201/36* (2013.01); *C09J 2201/602* (2013.01); *C09J 2203/326* (2013.01); *C09J 2205/102* (2013.01); *C09J 2433/00* (2013.01); *C09J 2463/00* (2013.01); *H01L 24/16* (2013.01); *H01L 2224/16225* (2013.01); *H01L 2224/271* (2013.01); *H01L 2224/27003* (2013.01); *H01L 2224/27848* (2013.01); *H01L 2224/294* (2013.01); *H01L 2224/2919* (2013.01); *H01L 2224/2929* (2013.01); *H01L 2224/2939* (2013.01); *H01L 2224/29082* (2013.01); *H01L 2224/29083* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29364* (2013.01); *H01L 2224/29499* (2013.01); *H01L 2224/32225* (2013.01); *H01L 2224/73204* (2013.01); *H01L 2224/81903* (2013.01); *H01L 2224/83101* (2013.01); *H01L 2224/83204* (2013.01); *H01L 2224/83851* (2013.01); *H01L 2224/83856* (2013.01); *H01L 2224/83862* (2013.01); *H01L 2224/83907* (2013.01); *H01L 2924/06* (2013.01); *H01L 2924/0635* (2013.01); *H01L 2924/0665* (2013.01); *H01L 2924/14* (2013.01); *H01L 2924/2021* (2013.01); *H01L 2924/2064* (2013.01); *H01L 2924/3511* (2013.01); *H01R 4/04* (2013.01); *H05K 3/323* (2013.01)

(56) References Cited

FOREIGN PATENT DOCUMENTS

| | | | |
|---|---|---|---|
| JP | 2009-016133 | A | 1/2009 |
| JP | 2010-033793 | A | 2/2010 |
| JP | 4789738 | B2 | 10/2011 |
| JP | 2013-058412 | A | 3/2013 |
| JP | 2013-105636 | A | 5/2013 |

OTHER PUBLICATIONS

May 12, 2015 Written Opinion issued in International Patent Application No. PCT/JP2015/052910.

Feb. 2, 2016 International Preliminary Report on Patentability issued in International Patent Application No. PCT/JP2015/052910.

Aug. 22, 2017 Notification of Reasons for Refusal issued in Japanese Patent Application No. 2014-019865.

Mar. 8, 2013 Office Action issued in Chinese Patent Appiication No. 201580007321.7.

* cited by examiner

ANISOTROPIC CONDUCTIVE FILM INCLUDING OBLIQUE REGION HAVING LOWER CURING RATIO

TECHNICAL FIELD

The present invention relates to an anisotropic conductive film and a production method of the same.

BACKGROUND ART

An anisotropic conductive film has been widely used in mounting of electronic components such as an IC chip. In recent years, an anisotropic conductive film having a two-layer structure in which conductive particles for anisotropic conductive connection are arranged in a single layer on an insulating adhesion layer has been proposed (Patent Literature 1), in order to improve the conduction reliability and the insulating properties, increase the mounting conductive particle capture ratio, and decrease the production cost from the viewpoints of application to high-density mounting.

This anisotropic conductive film having a two-layer structure is produced as follows. Conductive particles are arranged in a single layer and a close-packed state on a transfer layer, and then the transfer layer is biaxially stretched to form the transfer layer in which the conductive particles are uniformly arranged at predetermined intervals. After that, the conductive particles on the transfer layer are transferred into an insulating resin layer containing a thermosetting resin and a polymerization initiator, and another insulating resin layer containing a thermosetting resin and no polymerization initiator is laminated on the transferred conductive particles (Patent Literature 1).

CITATION LIST

Patent Literature

Patent Literature 1: Japanese Patent No. 4789738

SUMMARY OF INVENTION

Technical Problem

However, the insulating resin layer containing no polymerization initiator is used for the anisotropic conductive film having a two-layer structure in Patent Literature 1. Therefore, a comparatively large resin flow tends to occur in the insulating resin layer containing no polymerization initiator by heating during anisotropic conductive connection even with the conductive particles being uniformly arranged in a single layer at predetermined intervals. Along the resin flow, the conductive particles also tend to flow. Accordingly, there are problems of a decrease in mounting conductive particle capture ratio, occurrence of short circuit, and a decrease in insulating properties.

An object of the present invention is to solve the problems in the conventional techniques, and to achieve favorable conduction reliability, favorable insulating properties, and favorable mounting conductive particle capture ratio in an anisotropic conductive film having a multilayer structure having conductive particles arranged in a single layer.

Solution to Problem

The present inventors have found that an anisotropic conductive film obtained by arranging conductive particles in a single layer on a photopolymerizable resin layer, then irradiating the photopolymerizable resin layer with inclined ultraviolet light or with ultraviolet light inclined in at least two directions to fix or temporarily fix the conductive particles, and layering a thermo- or photo-cationically, anionically, or radically polymerizable resin layer on the fixed or temporarily fixed conductive particles has a configuration that can achieve the object of the present invention. The present invention has thus been completed.

A first aspect of the present invention provides an anisotropic conductive film having a first connection layer and a second connection layer formed on a surface of the first connection layer, wherein the first connection layer is a photopolymerized resin layer, the second connection layer is a thermo- or photo-cationically, anionically, or radically polymerizable resin layer, conductive particles for anisotropic conductive connection are arranged in a single layer on the surface of the first connection layer, and a region in which the curing ratio is lower than that of the surface of the first connection layer exists in a direction oblique to the thickness direction of the first connection layer.

A second aspect of the present invention provides an anisotropic conductive film having a first connection layer and a second connection layer formed on a surface of the first connection layer, wherein the first connection layer is a photopolymerized resin layer, the second connection layer is a thermo- or photo-cationically, anionically, or radically polymerizable resin layer, conductive particles for anisotropic conductive connection are arranged in a single layer on the surface of the first connection layer, and the curing ratio in a region that is relatively near another surface of the first connection layer among regions of the first connection layer in the vicinity of the conductive particles is lower than the curing ratio of the surface of the first connection layer.

In the present invention, it is preferable that the second connection layer be a thermo-polymerizable resin layer using a thermal polymerization initiator that initiates a polymerization reaction by heating. The second connection layer may be a photopolymerizable resin layer using a photopolymerization initiator that initiates a polymerization reaction by light. The second connection layer may be a thermo- and photo-polymerizable resin layer using a thermal polymerization initiator and a photopolymerization initiator in combination. Herein, the second connection layer may be restricted to a thermo-polymerizable resin layer using a thermal polymerization initiator in terms of production.

The anisotropic conductive film of the present invention may have a third connection layer that has the same configuration as that of the second connection layer on the other surface of the first connection layer in order to prevent a warping of a bonded body, such as stress relaxation or the like. Specifically, the anisotropic conductive film may have the third connection layer that includes a thermo- or photo-cationically, anionically, or radically polymerizable resin layer on the other surface of the first connection layer.

It is preferable that the third connection layer be a thermo-polymerizable resin layer using a thermal polymerization initiator that initiates a polymerization reaction by heating. The third connection layer may be a photopolymerizable resin layer using a photopolymerization initiator that initiates a polymerization reaction by light. The third connection layer may be a thermo- and photopolymerizable resin layer using a thermal polymerization initiator and a photopolymerization initiator in combination. Herein, the third connection layer may be restricted to a thermo-polymerizable resin layer using a thermal polymerization initiator in terms of production.

The present invention further provides a production method of the anisotropic conductive film of the first aspect of the present invention, including the following steps (A) to (C) of forming the first connection layer by a photopolymerization reaction in a single step, or the following steps (AA) to (DD) of forming the first connection layer by a photo-radical polymerization reaction in two steps.

(When First Connection Layer is Formed by Photopolymerization Reaction in Single Step)

Step (A)

a step of arranging conductive particles in a single layer on a photopolymerizable resin layer;

Step (B)

a step of irradiating the photopolymerizable resin layer having the arranged conductive particles with inclined ultraviolet light to cause a photo-radical polymerization reaction, to thereby form the first connection layer in which the conductive particles are fixed in a surface thereof; and Step (C)

a step of forming the second connection layer that includes a thermo- or photo-cationically or anionically polymerizable resin layer, or a thermo- or photo-radically polymerizable resin layer on the surface of the first connection layer on the side of the conductive particles.

(When First Connection Layer is Formed by Photopolymerization Reaction in Two Steps)

Step (AA)

a step of arranging conductive particles in a single layer on a photopolymerizable resin layer;

Step (BB)

a step of irradiating the photopolymerizable resin layer having the arranged conductive particles with inclined ultraviolet light to cause a photo-radical polymerization reaction, to thereby form a first temporary connection layer in which the conductive particles are temporarily fixed on a surface thereof;

Step (CC)

a step of forming the second connection layer that includes a thermo-cationically, anionically, or radically polymerizable resin layer on the surface of the first temporary connection layer on the side of the conductive particles; and Step (DD)

a step of irradiating the first temporary connection layer with ultraviolet light from a side opposite to the second connection layer to cause a photopolymerization reaction, to thereby fully cure the first temporary connection layer to form the first connection layer.

Moreover, the present invention provides a production method of the anisotropic conductive film of the second aspect of the present invention, including the following steps (A') to (C') of forming the first connection layer by a photopolymerization reaction in a single step, or the following steps (AA') to (DD') of forming the first connection layer by a photopolymerization reaction in two steps.

(When First Connection Layer is Formed by Photopolymerization Reaction in Single Step)

Step (A')

a step of arranging conductive particles in a single layer on a photopolymerizable resin layer;

Step (B')

a step of irradiating the photopolymerizable resin layer having the arranged conductive particles with ultraviolet light inclined in at least two directions to cause a photopolymerization reaction, to thereby form the first connection layer in which the conductive particles are fixed in a surface thereof; and Step (C')

a step of forming the second connection layer that includes a thermo- or photo-cationically, anionically, or radically polymerizable resin layer on the surface of the first connection layer on the side of the conductive particles.

(When First Connection Layer is Formed by Photopolymerization Reaction in Two Steps)

Step (AA')

a step of arranging conductive particles in a single layer on a photopolymerizable resin layer;

Step (BB')

a step of irradiating the photopolymerizable resin layer having the arranged conductive particles with ultraviolet light inclined in at least two directions to cause a photopolymerization reaction, to thereby form a first temporary connection layer in which the conductive particles are temporarily fixed on a surface thereof;

Step (CC')

a step of forming the second connection layer that includes a thermo-cationically, anionically, or radically polymerizable resin layer on the surface of the first temporary connection layer on the side of the conductive particles; and Step (DD')

a step of irradiating the first temporary connection layer with ultraviolet light from a side opposite to the second connection layer to cause a photopolymerization reaction, to thereby fully cure the first temporary connection layer to form the first connection layer.

An initiator used in the formation of the second connection layer at the steps (CC) and (CC') is restricted to a thermal polymerization initiator in order not to adversely affect the product life of the anisotropic conductive film, connection, and the stability of a connection structure. Specifically, when the first connection layer is irradiated with ultraviolet light in two steps, the second connection layer may be restricted to a material to be cured by thermal polymerization in terms of restriction of the step. When the irradiation in two steps is continuously performed, the second connection layer can be formed at the same step as the step in the single step. Therefore, the same function effect can be expected.

The present invention also provides a production method of the anisotropic conductive film having the third connection layer having the same configuration as that of the second connection layer on the other surface of the first connection layer, the production method including the following step (Z) after the step (C) in addition to the steps (A) to (C) (or after the step (C') in addition to the steps (A') to (C')), or the following step (Z) after the step (DD) in addition to the steps (AA) to (DD) (or after the step (DD') in addition to the steps (AA') to (DD')).

Step (Z)

A step of forming the third connection layer that includes a thermo- or photo-cationically, anionically, or radically polymerizable resin layer on a surface of the first connection layer opposite to the conductive particles.

Further, the present invention provides a production method of the anisotropic conductive film having the third connection layer having the same configuration as that of the second connection layer on the other surface of the first connection layer, the production method including the following step (a) before the step (A) in addition to the steps (A) to (C) (or before the step (A') in addition to the steps (A') to (C')), or the following step (a) before the step (AA) in addition to the steps (AA) to (DD) (or before the step (AA') in addition to the steps (AA') to (DD')).

Step (a)

A step of forming the third connection layer that includes a thermo- or photo-cationically, anionically, or radically polymerizable resin layer on the surface of the photopolymerizable resin layer.

In the step (A) or (A'), or (AA) or (AA') in the production method including this step (a), the conductive particles may be arranged in a single layer on the other surface of the photopolymerizable resin layer.

When the third connection layer is provided in such a step, it is preferable that the polymerization initiator be restricted to an initiator that acts by a thermal reaction because of the above-described reason. However, when the second and third connection layers containing a photopolymerization initiator are provided by a method that does not adversely affect the product life and connection after the formation of the first connection layer, the formation of the anisotropic conductive film containing the photopolymerization initiator in accordance with the main object of the present invention is not particularly restricted.

The present invention also encompasses an aspect in which the second or third connection layer functions as a tacky layer.

The present invention further provides a connection structure in which a first electronic component and a second electronic component are connected by anisotropic conductive connection through the aforementioned anisotropic conductive film.

Advantageous Effects of Invention

The anisotropic conductive film of each of the first and second aspects of the present invention has the first connection layer that is a photopolymerized resin layer, and the second connection layer that includes a thermo- or photo-cationically, anionically, or radically polymerizable resin layer formed on a surface of the first connection layer. In addition, the conductive particles for anisotropic conductive connection are arranged in a single layer on the surface of the first connection layer on the side of the second connection layer. Thus, the conductive particles can be firmly fixed on the first connection layer. Regarding the curing ratio of the first connection layer in the anisotropic conductive film of the first aspect of the present invention, a region in which the curing ratio is lower than that of the surface of the first connection layer on the side of the second connection layer exists in a direction oblique to the thickness direction of the first connection layer since the irradiation with inclined light is performed. For this reason, the direction of the region in which the curing ratio is low and flow directions of the conductive particles can be aligned in the oblique direction during anisotropic conductive connection. Therefore, the occurrence of short circuit can be largely suppressed without impairing the initial conduction properties and the conduction reliability. In the anisotropic conductive film of the second aspect of the present invention, the irradiation with ultraviolet light inclined in at least two directions is performed. Therefore, a region under (on the back side of) the conductive particles in the first connection layer is not sufficiently irradiated with ultraviolet light due to the presence of the conductive particles. Accordingly, the curing ratio is relatively low. In other words, the curing ratio in a region that is relatively near another surface of the first connection layer among regions of the first connection layer in the vicinity of the conductive particles is lower than that of the surface of the first connection layer (the surface on the side of the second connection layer). Therefore, the region under (on the back side of) the conductive particles in the first connection layer exhibits favorable pushing properties. Accordingly, favorable conduction reliability, insulating properties, and mounting conductive particle capture ratio can be achieved. The region of the first connection layer in the vicinity of the conductive particles represents a region that surrounds the conductive particles and has a width that is 0.2 to 5 times the diameters of the conductive particles. It is desirable that the region in which the curing ratio of the first connection layer is relatively low exist only within the first connection layer. This is because the conductive particles are prevented from shifting in a direction other than a connection direction at the initial time of pushing during connection.

When heat is used in anisotropic conductive connection, the anisotropic conductive connection is performed by the same method as a general method of connecting an anisotropic conductive film. When light is used, pushing by a connection tool may be performed by the end of a reaction. In this case, the connection tool or the like is often heated to promote resin flow and particle pushing. Even when heat and light are used in combination, the anisotropic conductive connection may be performed in the same manner as described above.

DESCRIPTION OF EMBODIMENTS

<<Anisotropic Conductive Film of the Present Invention>>

Hereinafter, a preferable example of the anisotropic conductive film of the first aspect and the second aspect of the present invention (hereinafter, simply referred to as the anisotropic conductive film of the present invention) will be described in detail.

Figure 1:
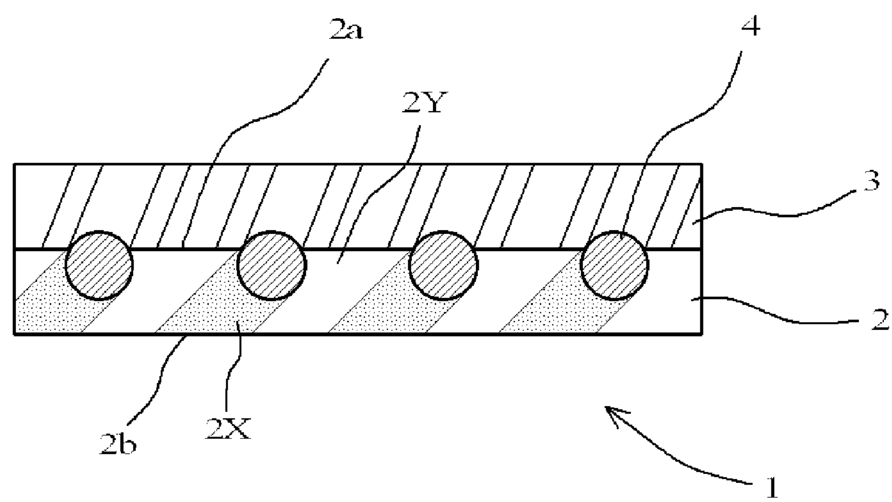
FIG. 1 is a cross-sectional view of an anisotropic conductive film of the first aspect of the present invention.
Figure 10:
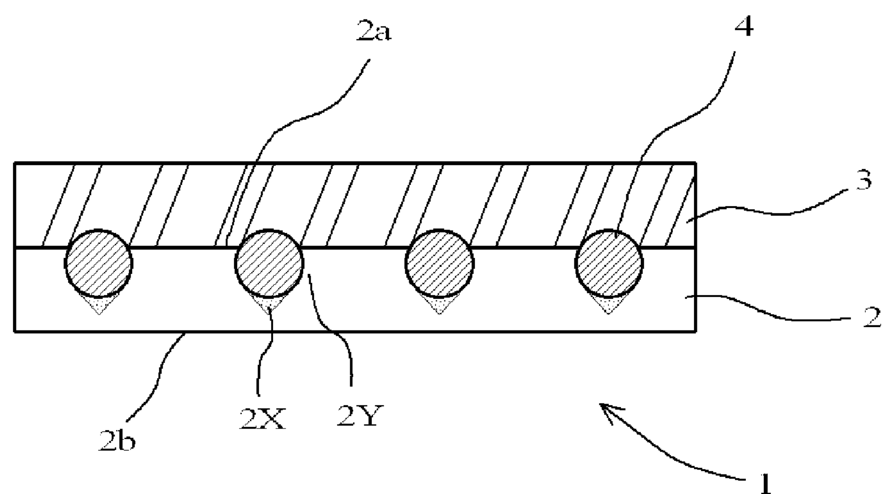
FIG. 10 is a cross-sectional view of an anisotropic conductive film of the second aspect of the present invention.

An anisotropic conductive film 1 of the first aspect of the present invention as shown in FIG. 1 and an anisotropic conductive film 1 of the second aspect of the present invention as shown in FIG. 10 each have a configuration in which a second connection layer 3 that includes a thermo- or photo-cationically, anionically, or radically polymerizable resin layer is formed on a surface of a first connection layer 2 that includes a photopolymerized resin layer obtained by photopolymerizing a photopolymerizable resin layer. On a surface 2*a* of the first connection layer 2 on the side of the second connection layer 3, conductive particles 4 for anisotropic conductive connection are arranged in a single layer, and preferably uniformly arranged. The expression "uniformly" herein means a state where the conductive particles are arranged in a plane direction. This regularity may be defined as constant intervals.

<First Connection Layer 2>

The first connection layer 2 constituting the anisotropic conductive film 1 of the present invention is a photopolymerized resin layer obtained by photopolymerizing a photopolymerizable resin layer such as a photo-cationically, anionically, or radically polymerizable resin layer. Therefore, the conductive particles can be fixed. Because of polymerization, the resin is unlikely to flow even under heating during anisotropic conductive connection. Therefore, the occurrence of short circuit can be largely suppressed. Accordingly, the conduction reliability and the insulating properties can be improved, and the mounting particle capture ratio can be improved. It is particularly preferable that the first connection layer 2 be a photo-radically polymerized resin layer obtained by photo-radically polymerizing a photo-radically polymerizable resin layer containing an acrylate compound and a photo-radical polymerization initiator. Hereinafter, a case where the first connection layer 2 is a photo-radically polymerized resin layer will be described.

(Acrylate Compound)

As an acrylate compound that is an acrylate unit, a conventionally known photo-radically polymerizable acrylate can be used. For example, a monofunctional (meth) acrylate (herein, (meth)acrylate includes acrylate and methacrylate), or a multifunctional (meth)acrylate having two or more functional groups can be used. In the present invention, in order to obtain a thermosetting adhesive, it is preferable that a multifunctional (meth)acrylate be used in at least a portion of acrylic monomers.

When the content of the acrylate compound in the first connection layer 2 is too small, a difference in viscosity between the first connection layer 2 and the second connection layer 3 is unlikely to be generated. When the content thereof is too large, the curing shrinkage increases and the workability tends to decrease. Therefore, the content thereof is preferably 2 to 70% by mass, and more preferably 10 to 50% by mass.

(Photo-Radical Polymerization Initiator)

As the photo-radical polymerization initiator, a publicly known photo-radical polymerization initiator can be appropriately selected and used. Examples of the publicly known photo-radical polymerization initiator may include an acetophenone-based photopolymerization initiator, a benzylketal-based photopolymerization initiator, and a phosphorus-based photopolymerization initiator.

When the amount of the photo-radical polymerization initiator to be used is too small relative to 100 parts by mass of the acrylate compound, photo-radical polymerization does not sufficiently proceed. When the amount is too large, stiffness may decrease. Therefore, the amount is preferably 0.1 to 25 parts by mass, and more preferably 0.5 to 15 parts by mass.

(Conductive Particles)

As the conductive particles, conductive particles used in conventionally known anisotropic conductive films can be appropriately selected and used. Examples of the conductive particles may include metal particles such as nickel, cobalt, silver, copper, gold, and palladium particles, and metal-coated resin particles. Two or more kinds thereof may be used in combination.

When the average particle diameter of the conductive particles is too small, the variation of heights of wirings cannot be absorbed, and the resistance tends to increase. When the average particle diameter is too large, short circuit tends to occur. Therefore, the average particle diameter is preferably 1 to 10 μm, and more preferably 2 to 6 μm.

When the amount of such conductive particles in the first connection layer 2 is too small, the capture number of mounting conductive particles decreases, and the anisotropic conductive connection is difficult. When the amount is too large, short circuit may occur. Therefore, the amount is preferably 50 to 50,000, and more preferably 200 to 30,000 per square millimeter.

In the first connection layer 2, if necessary, a film-forming resin such as a phenoxy resin, an epoxy resin, an unsaturated polyester resin, a saturated polyester resin, a urethane resin, a butadiene resin, a polyimide resin, a polyamide resin, and a polyolefin resin can also be used in combination. In the second and third connection layers, the film-forming resin may also be used in combination similarly.

When the thickness of the first connection layer 2 is too small, the mounting conductive particle capture ratio tends to decrease. When the thickness is too large, the conduction resistance tends to increase. Therefore, the thickness is preferably 1.0 to 6.0 μm, and more preferably 2.0 to 5.0 μm.

The first connection layer 2 may further contain an epoxy compound and a thermo- or photo-cationic or anionic polymerization initiator. In this case, it is preferable that the second connection layer 3 be also a thermo- or photo-cationically or anionically polymerizable resin layer containing an epoxy compound and a thermo- or photo-cationic or anionic polymerization initiator, as described below. Thus, the delamination strength can be improved. The epoxy compound and the thermo- or photo-cationic or anionic polymerization initiator will be described in the second connection layer 3.

In the first connection layer 2, it is preferable that the conductive particles 4 eat into the second connection layer 3 (i.e., the conductive particles 4 be exposed to the surface of the first connection layer 2), as shown in FIG. 1 (or FIG. 10). This is because when all the conductive particles are embedded in the first connection layer 2, the connection resistance may increase. When a degree of eating-into is too small, the mounting conductive particle capture ratio tends to decrease. When the degree is too large, the conduction resistance tends to increase. Therefore, the degree is preferably 10 to 90%, and more preferably 20 to 80% of the average particle diameter of the conductive particles.

In the first connection layer 2 of the anisotropic conductive film of the first aspect of the present invention as shown in FIG. 1, irradiation with inclined light is performed. Therefore, a region in which the curing ratio is lower than that of the surface of the first connection layer on the side of the second connection layer exists in a direction oblique to the thickness direction of the first connection layer. Thus, a region 2X of the first connection layer is easily eliminated during thermoscompression-bonding of anisotropic conductive connection. The conduction reliability is improved. The curing ratio herein represents a value defined as a decrease ratio of a vinyl group. The curing ratio in the region 2X of the first connection layer is preferably 40 to 80%, and the curing ratio in a region 2Y of the first connection layer is preferably 70 to 100%.

In the first connection layer 2 of the anisotropic conductive film of the second aspect of the present invention as shown in FIG. 10, it is preferable that the curing ratio in a region (a region 2X of the first connection layer) that is relatively near the other surface (the outermost surface 2*b*) of the first connection layer 2 among regions of the first connection layer 2 in the vicinity of the conductive particles be lower than that of the surface of the first connection layer 2 (the surface on the side of the second connection layer) (a region 2Y of the first connection layer). Thus, the region 2X of the first connection layer is easily eliminated during thermocompression-bonding of anisotropic conductive connection. The conduction reliability is improved. The curing ratio herein represents a value defined as a decrease ratio of a vinyl group. The curing ratio in the region 2X of the first connection layer is preferably 40 to 80%, and the curing ratio in the region 2Y of the first connection layer is preferably 70 to 100%.

Photo-radical polymerization for formation of the first connection layer 2 may be performed in a single step (that is, by one irradiation with light), or in two steps (that is, by two-times irradiations with light). In this case, it is preferable that the second connection layer 3 be formed on the surface of the first connection layer 2 and another surface of the first connection layer 2 be then irradiated with light at the second step under an oxygen-containing atmosphere (in the air). As a result, a radical polymerization reaction is inhibited by oxygen to increase the surface concentration of an uncured component. Thus, an effect capable of improving the tackiness can be expected. Curing in two steps makes the polymerization reaction complex. Therefore, detailed control of fluidity of the resin and the particles can be expected.

In the region 2X of the first connection layer in such photo-radical polymerization in two steps, the curing ratio at the first step is preferably 10 to 50%, and the curing ratio at the second step is preferably 40 to 80%. In the region 2Y of the first connection layer, the curing ratio at the first step is preferably 30 to 90%, and the curing ratio at the second step is preferably 70 to 100%.

When a photo-radical polymerization reaction for formation of the first connection layer 2 is performed in two steps, only one kind of a radical polymerization initiator may be used. It is preferable, however, that two kinds of photo-radical polymerization initiators having different wavelength ranges that initiate a radical reaction be used in order to improve the tackiness. For example, it is preferable that a photo-radical polymerization initiator that initiates a radical reaction by light having a wavelength of 365 nm from an LED light source (for example, IRGACURE 369 available from BASF Japan Ltd.) and a photo-radical polymerization initiator that initiates a radical reaction by light from a light source of a high pressure mercury lamp (for example, IRGACURE 2959 available from BASF Japan Ltd.) be used in combination. When the two kinds of different photo-radical polymerization initiators are used, bonding of the resin is complicated. As a result, a behavior of thermal flow of the resin during connection can be finely controlled. This is because a force in a thickness direction tends to be applied to the particles and the flow of the particles in a plane direction is suppressed upon pushing during anisotropic conductive connection. The effects of the present invention tend to be expressed.

The lowest melt viscosity of the first connection layer 2 measured by a rheometer is higher than that of the second connection layer 3. Specifically, a value of [the lowest melt viscosity of the first connection layer 2 (mPa·s)]/[the lowest melt viscosity of the second connection layer 3 (mPa·s)] is preferably 1 to 1,000, and more preferably 4 to 400. Among the lowest melt viscosities, the lowest melt viscosity of the former is preferably 100 to 100,000 mPa·s, and more preferably 500 to 50,000 mPa·s. The lowest melt viscosity of the latter is preferably 0.1 to 10,000 mPa·s, and more preferably 0.5 to 1,000 mPa·s.

The first connection layer 2 can be formed by attaching the conductive particles to the photo-radically polymerizable resin layer containing a photo-radically polymerizable acrylate and a photo-radical polymerization initiator by a procedure such as a film transfer method, a mold transfer method, an inkjet method, and an electrostatic attachment method and irradiating the photo-radically polymerizable resin layer with ultraviolet light from a side of the conductive particles, an opposite side thereof, or both the sides. It is preferable that the photo-radically polymerizable resin layer be irradiated with ultraviolet light from only the conductive particle side since the curing ratio in the region 2X of the first connection layer can be relatively decreased.

<Second Connection Layer 3>

The second connection layer 3 includes a thermo- or photo-cationically, anionically, or radically polymerizable resin layer, and preferably includes a thermo- or photo-cationically or anionically polymerizable resin layer containing an epoxy compound and a thermal or photo-cationic or anionic polymerization initiator, or a thermo- or photo-radically polymerizable resin layer containing an acrylate compound and a thermo- or photo-radical polymerization initiator. Herein, it is preferable that the second connection layer 3 be formed from the thermo-polymerizable resin layer in terms of convenience of production and quality stability since a polymerization reaction does not occur in the second connection layer 3 by irradiation with ultraviolet light for formation of the first connection layer 2.

When the second connection layer 3 is the thermo- or photo-cationically or anionically polymerizable resin layer, the second connection layer 3 may further contain an acrylate compound and a thermo- or photo-radical polymerization initiator. Thus, the delamination strength from the first connection layer 2 can be improved.

(Epoxy Compound)

When the second connection layer 3 is the thermo- or photo-cationically or anionically polymerizable resin layer containing an epoxy compound and a thermo- or photo-cationic or anionic polymerization initiator, examples of the epoxy compound may include a compound or a resin having two or more epoxy groups in the molecule. The compound and the resin may be liquid or solid.

(Thermal Cationic Polymerization Initiator)

As the thermal cationic polymerization initiator, a publicly known thermal cationic polymerization initiator for an epoxy compound can be used. For example, the thermal cationic polymerization initiator generates an acid, which can cationically polymerize a cationically polymerizable compound, by heat. A publicly known iodonium salt, sulfonium salt, phosphonium salt, or ferrocenes can be used. An aromatic sulfonium salt that exhibits favorable latency for temperature can be preferably used.

When the amount of the thermal cationic polymerization initiator to be added is too small, curing tends to be difficult. When the amount is too large, the product life tends to be reduced. Therefore, the amount is preferably 2 to 60 parts by mass, and more preferably 5 to 40 parts by mass, relative to 100 parts by mass of the epoxy compound.

(Thermal Anionic Polymerization Initiator)

As the thermal anionic polymerization initiator, a publicly known thermal anionic polymerization initiator for an epoxy compound can be used. For example, the thermal anionic polymerization initiator generates a base, which can anionically polymerize an anionically polymerizable compound, by heat. A publicly known aliphatic amine-based compound, aromatic amine-based compound, secondary or tertiary amine-based compound, imidazole-based compound, polymercaptan-based compound, boron trifluoride-amine complex, dicyandiamide, or organic acid hydrazide can be used. An encapsulated imidazole-based compound that exhibits favorable latency for temperature can be preferably used.

When the amount of the thermal anionic polymerization initiator to be added is too small, curing tends to be difficult. When the amount is too large, the product life tends to be reduced. Therefore, the amount is preferably 2 to 60 parts by mass, and more preferably 5 to 40 parts by mass, relative to 100 parts by mass of the epoxy compound.

(Photo-Cationic Polymerization Initiator and Photo-Anionic Polymerization Initiator)

As the photo-cationic polymerization initiator or the photo-anionic polymerization initiator for an epoxy compound, a publicly known polymerization initiator can be appropriately used.

(Acrylate Compound)

When the second connection layer 3 is the thermo- or photo-radically polymerizable resin layer containing an acrylate compound and a thermal or photo-radical polymerization initiator, the acrylate compound described in relation to the first connection layer 2 can be appropriately selected and used.

(Thermal Radical Polymerization Initiator)

Examples of the thermal radical polymerization initiator may include an organic peroxide and an azo-based compound. An organic peroxide that does not generate nitrogen causing bubbles can be preferably used.

When the amount of the thermal radical polymerization initiator to be used is too small, curing is difficult. When the amount is too large, the product life is reduced. Therefore, the amount is preferably 2 to 60 parts by mass, and more preferably 5 to 40 parts by mass, relative to 100 parts by mass of the acrylate compound.

(Photo-Radical Polymerization Initiator)

As the photo-radical polymerization initiator for an acrylate compound, a publicly known photo-radical polymerization initiator can be used.

When the amount of the photo-radical polymerization initiator to be used is too small, curing is difficult. When the amount is too large, the product life is reduced. Therefore, the amount is preferably 2 to 60 parts by mass, and more preferably 5 to 40 parts by mass, relative to 100 parts by mass of the acrylate compound.

(Third Connection Layer 5)

Figure 5:
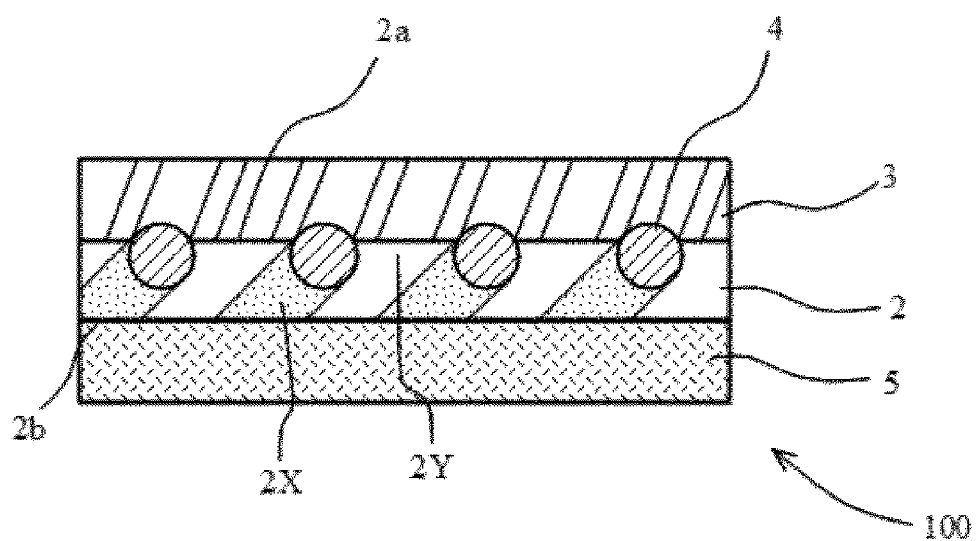
FIG. 5 is a cross-sectional view of an anisotropic conductive film encompassed by the first aspect of the present invention.
Figure 14:
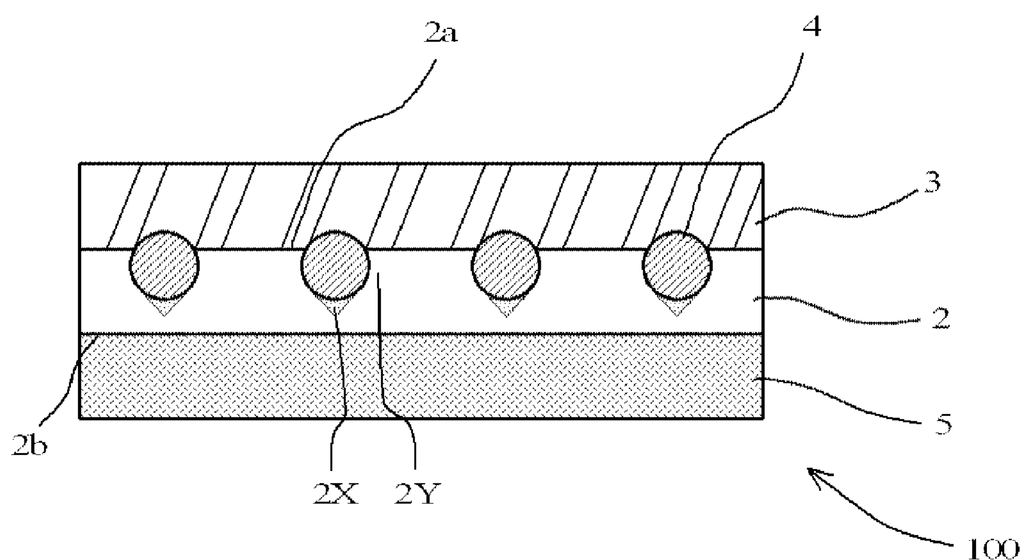
FIG. 14 is a cross-sectional view of an anisotropic conductive film of the second aspect of the present invention.

The anisotropic conductive film having a two-layer structure in FIG. 1 and FIG. 10 is described above. As shown in FIG. 5 and FIG. 14, a third connection layer 5 may be formed on another surface of the first connection layer 2. Thus, an effect capable of finely controlling the fluidity of the whole layer can be obtained. Herein, the third connection layer 5 may have the same configuration as that of the second connection layer 3. Specifically, the third connection layer 5 includes a thermo- or photo-cationically or anionically or radically polymerizable resin layer as in the second connection layer 3. After the second connection layer is formed on a surface of the first connection layer, such a third connection layer 5 may be formed on another surface of the first connection layer. Alternatively, before formation of the second connection layer, the third connection layer may be formed in advance on another surface (where the second connection layer is not formed) of the first connection layer or the photopolymerizable resin layer as a precursor.

<<Production Method of Anisotropic Conductive Film of First Aspect of the Present Invention>>

The production method of the anisotropic conductive film of the first aspect of the present invention includes a production method that performs a photopolymerization reaction in a single step and a production method that performs a photopolymerization reaction in two steps.

<Production Method that Performs Photopolymerization Reaction in Single Step>

One example in which the anisotropic conductive film of FIG. 1 (FIG. 4B) is produced by photo-polymerization in a single step will be described. This production example includes the following steps (A) to (C).

(Step (A))

Figure 2:
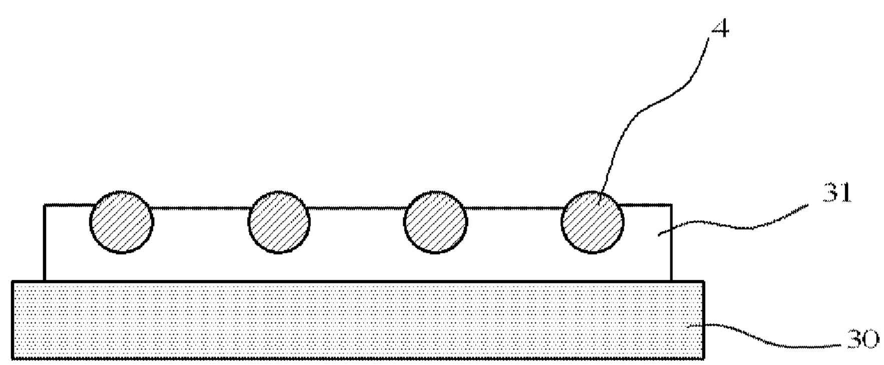
FIG. 2 is an explanatory diagram of a production step (A) of the anisotropic conductive film of the first aspect of the present invention.

As shown in FIG. 2, the conductive particles 4 are arranged in a single layer on a photopolymerizable resin layer 31 that is formed on a release film 30, if necessary. A procedure of arranging the conductive particles 4 is not particularly limited. A method using a biaxial stretching operation for an unstretched polypropylene film in Example 1 of Japanese Patent No. 4789738, a method using a mold in Japanese Patent Application Laid-Open No. 2010-33793, or other methods may be used. For the degree of arrangement, the size, conduction reliability, insulating properties, and mounting conductive particle capture ratio of a connection subject are taken in account. The conductive particles are preferably arranged so as to be two-dimensionally apart about 1 to about 100 μm from each other.

(Step (B))

Figure 3A:
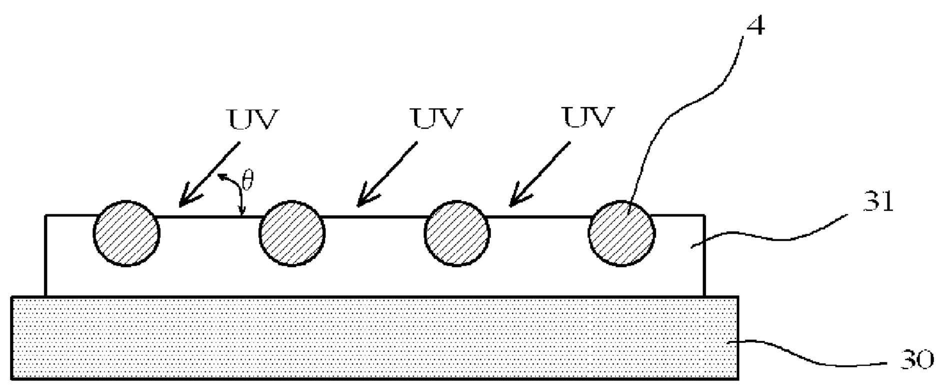
FIG. 3A is an explanatory diagram of a production step (B) of the anisotropic conductive film of the first aspect of the present invention.
Figure 3B:
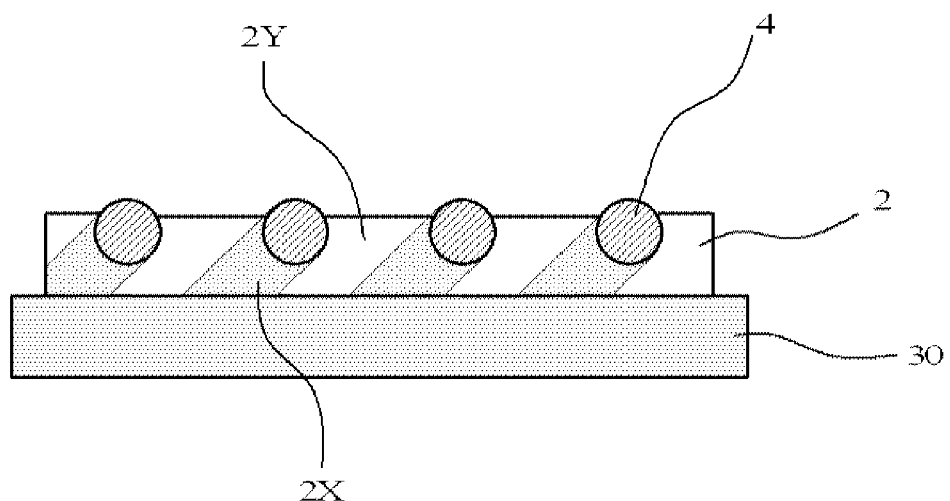
FIG. 3B is an explanatory diagram of the production step (B) of the anisotropic conductive film of the first aspect of the present invention.

As shown in FIG. 3A, the photopolymerizable resin layer 31 having the arranged conductive particles 4 is irradiated with inclined ultraviolet light (UV) from the side of the conductive particles using an LED light source or the like to cause a photopolymerization reaction, whereby the first connection layer 2 in which the conductive particles 4 are fixed in a surface thereof is formed. As a result, the curing ratio in an oblique region 2X of the first connection layer between the conductive particles 4 and the outermost surface of the first connection layer 2 can be made lower than that in a region 2Y of the first connection layer between the adjacent conductive particles 4, as shown in FIG. 3B. If necessary, the irradiation may be performed using pulsed ultraviolet light or the irradiation may be performed using a shutter. Thus, the curing properties on back side of the particles are accurately reduced to facilitate pushing during bonding. In addition, the flow directions of the conductive particles can be aligned in an oblique direction, the conductive particles can be prevented from being excessively coupled, and the occurrence of short circuit can be suppressed.

The irradiation with inclined ultraviolet light means that the photopolymerizable resin layer 31 is irradiated with ultraviolet light at an inclination angle θ. This inclination angle θ is $0° < \theta < 90°$, and preferably 30° $\theta \leq 60°$. In this case, it is preferable that ultraviolet light be inclined in a direction orthogonal to the longitudinal direction of the anisotropic conductive film. Thus, the flow directions of the conductive particles can be made the same as the longitudinal direction of a bump (i.e., the width direction of the anisotropic conductive film). In this case, it is preferable that a left half of the photopolymerizable resin layer in the longitudinal direction of the anisotropic conductive film be masked, a right half thereof be irradiated with inclined ultraviolet light so that flow toward the right side of the anisotropic conductive film occurs, the right half be then masked, and the left half be irradiated with inclined ultraviolet light so that flow toward the left side of the anisotropic conductive film occurs.

(Step (C))

Figure 4A:
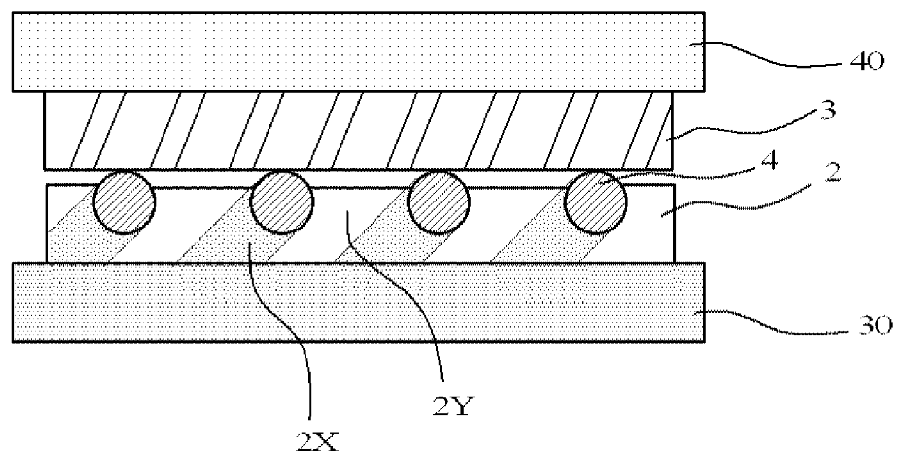
FIG. 4A is an explanatory diagram of a production step (C) of the anisotropic conductive film of the first aspect of the present invention.
Figure 4B:
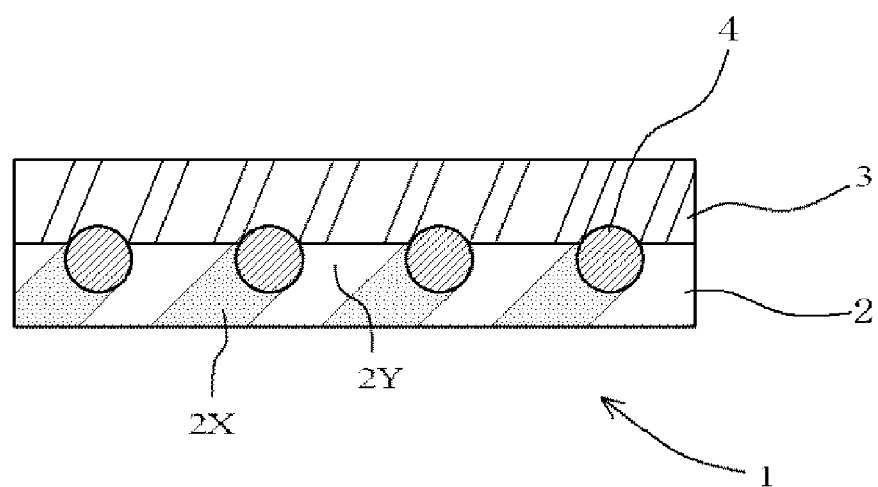
FIG. 4B is an explanatory diagram of the production step (C) of the anisotropic conductive film of the first aspect of the present invention.

As shown in FIG. 4A, the second connection layer 3 that includes a thermo- or photo-cationically, anionically, or radically polymerizable resin layer is formed on a surface of the first connection layer 2 on a side of the conductive particles 4. Specifically, the second connection layer 3 formed by an ordinary method on a release film 40 is placed on the surface of the first connection layer 2 on the side of the conductive particles 4 and thermocompression-bonding is performed so as not to cause excess thermal polymerization. The release films 30 and 40 are removed. Thus, an anisotropic conductive film of FIG. 4B can be obtained.

An anisotropic conductive film 100 of FIG. 5 can be obtained by performing the following step (Z) after the step (C).

(Step (Z))

The third connection layer that includes a thermo- or photo-cationically, anionically, or radically polymerizable resin layer is formed on a surface of the first connection layer opposite to the conductive particles, preferably like the second connection layer. Thus, the anisotropic conductive film of FIG. 5 can be obtained.

The anisotropic conductive film 100 of FIG. 5 can be obtained by performing the following step (a) before the step (A) without performing the step (Z).

(Step (a))

This step is a step of forming the third connection layer that includes a thermo- or photo-cationically, anionically, or radically polymerizable resin layer on a surface of the photopolymerizable resin layer. After this step (a), the anisotropic conductive film 100 of FIG. 5 can be obtained by performing the steps (A), (B), and (C). At the step (A), however, the conductive particles are arranged in a single layer on another surface of the photo-radically polymerizable resin layer.

(Production Method that Performs Photo-Radical Polymerization Reaction in Two Steps)

One example in which the anisotropic conductive film of FIG. 1 (FIG. 4B) is produced by photo-polymerization in two steps will be described. This production example includes the following steps (AA) to (DD).

(Step (AA))

Figure 6:
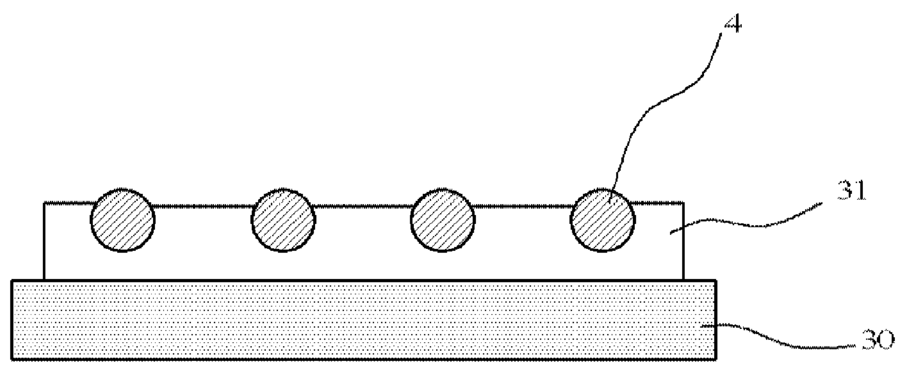
FIG. 6 is an explanatory diagram of a production step (AA) of the anisotropic conductive film of the present invention.

As shown in FIG. 6, the conductive particles 4 are arranged in a single layer on the photopolymerizable resin layer 31 that is formed on the release film 30, if necessary. A procedure of arranging the conductive particles 4 is not particularly limited. The method using a biaxial stretching operation for an unstretched polypropylene film in Example 1 of Japanese Patent No. 4789738, the method using a mold in Japanese Patent Application Laid-Open No. 2010-33793, or other methods may be used. For the degree of arrangement, the size, conduction reliability, insulating properties, and mounting conductive particle capture ratio of a connection subject are taken in account. The conductive particles are preferably arranged so as to be two-dimensionally apart about 1 to about 100 μm from each other.

(Step (BB))

Figure 7A:
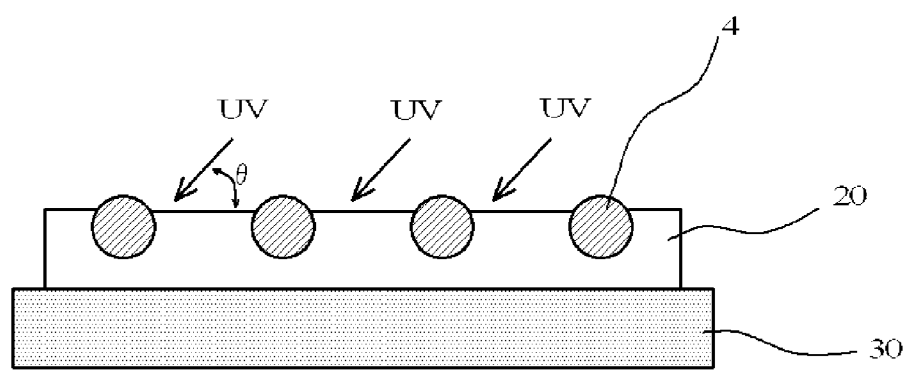
FIG. 7A is an explanatory diagram of a production step (BB) of the anisotropic conductive film of the first aspect of the present invention.
Figure 7B:
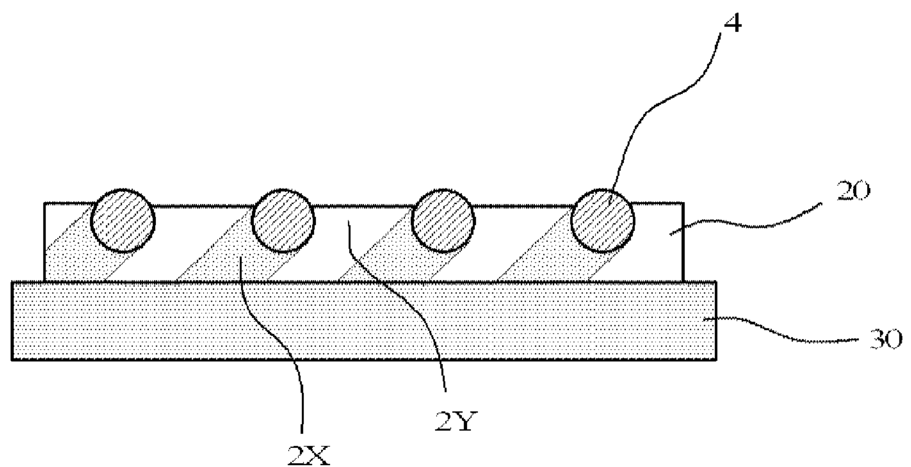
FIG. 7B is an explanatory diagram of the production step (BB) of the anisotropic conductive film of the first aspect of the present invention.

As shown in FIG. 7A, the photopolymerizable resin layer 31 having the arranged conductive particles 4 is irradiated with inclined ultraviolet light (UV) from the side of the conductive particles to cause a photo-radical polymerization reaction, and a first temporary connection layer 20 in which the conductive particles 4 are temporarily fixed on a surface is formed. As a result, the curing ratio in an oblique region 2X of the first temporary connection layer between the conductive particles 4 and the outermost surface of the first temporary connection layer 20 can be made lower than that in a region 2Y of the first temporary connection layer between the adjacent conductive particles 4, as shown in FIG. 7B.

(Step (CC))

Figure 8A:
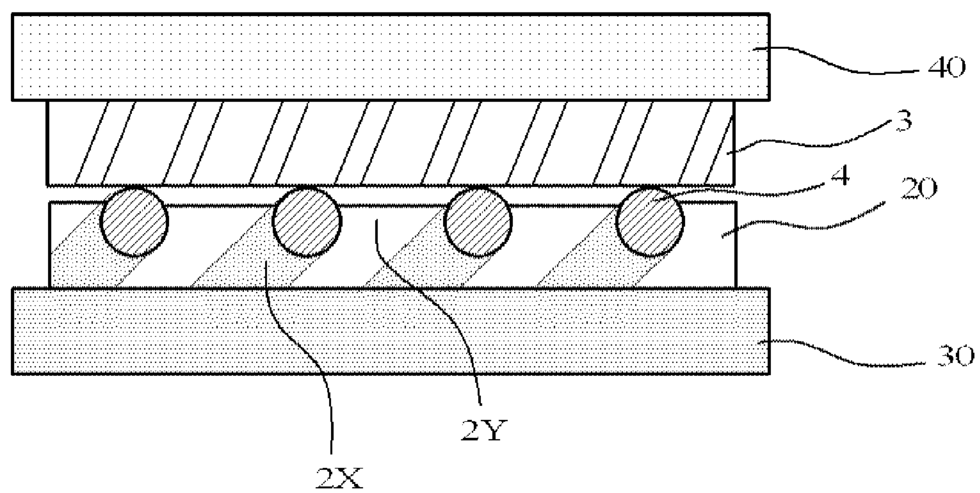
FIG. 8A is an explanatory diagram of a production step (CC) of the anisotropic conductive film of the first aspect of the present invention.
Figure 8B:
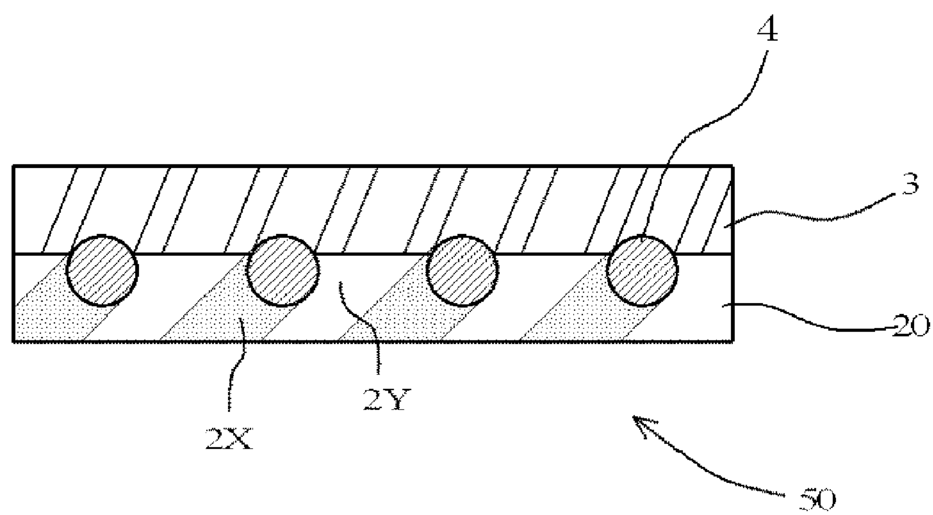
FIG. 8B is an explanatory diagram of the production step (CC) of the anisotropic conductive film of the first aspect of the present invention.

As shown in FIG. 8A, the second connection layer 3 that includes a thermo-cationically, anionically, or radically polymerizable resin layer is formed on a surface of the first temporary connection layer 20 on a side of the conductive particles 4. Specifically, the second connection layer 3 formed by an ordinary method on the release film 40 is disposed on the surface of the first connection layer 2 on the side of the conductive particles 4 and thermocompression-bonding is performed so as not to cause excess thermal polymerization. The release films 30 and 40 are removed. Thus, a temporary anisotropic conductive film 50 of FIG. 8B can be obtained.

(Step (DD))

Figure 9A:
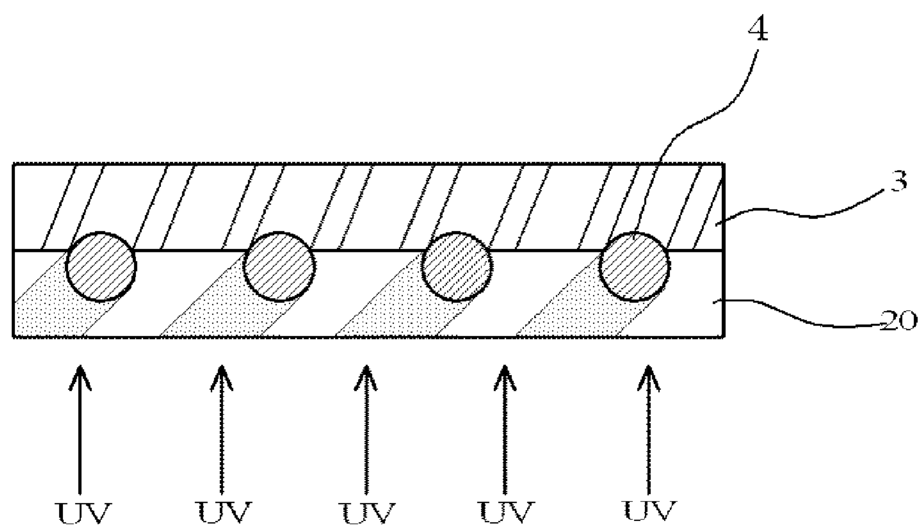
FIG. 9A is an explanatory diagram of a production step (DD) of the anisotropic conductive film of the first aspect of the present invention.
Figure 9B:
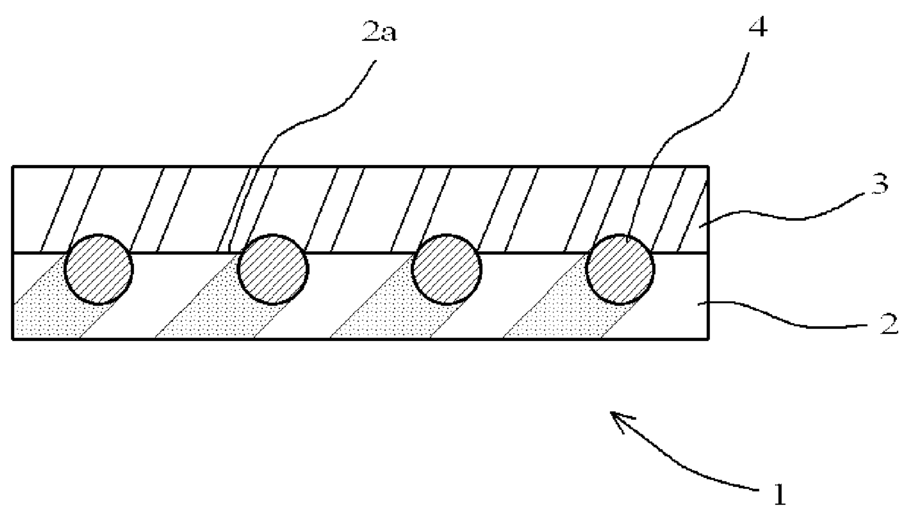
FIG. 9B is an explanatory diagram of the production step (DD) of the anisotropic conductive film of the first aspect of the present invention.

As shown in FIG. 9A, the first temporary connection layer 20 is irradiated with ultraviolet light using an LED light source, for example, from the side opposite to the second connection layer 3 to cause a photo-radical polymerization reaction, so that the first temporary connection layer 20 is fully cured to form the first connection layer 2. Thus, an anisotropic conductive film 1 of FIG. 9B can be obtained. At this step, it is preferable that the first temporary connection layer be irradiated with ultraviolet light in a direction perpendicular to the first temporary connection layer. In order not to eliminate a difference in curing ratio between the regions 2X and 2Y of the first connection layer, it is preferable that irradiation be performed through a mask or a difference in amount of irradiated light be produced by an irradiated portion.

When the photo-radical polymerization is caused in two steps, the anisotropic conductive film 100 of FIG. 5 can be obtained by performing the following step (Z) after the step (DD).

(Step (Z))

The third connection layer that includes a thermo- or photo-cationically, anionically, or radically polymerizable resin layer is formed on a surface of the first connection layer opposite to the conductive particles, preferably like the second connection layer. Thus, the anisotropic conductive film of FIG. 5 can be obtained.

The anisotropic conductive film 100 of FIG. 5 can be obtained by performing the following step (a) before the step (AA) without performing the step (Z).

(Step (a))

This step is a step of forming the third connection layer that includes a thermo- or photo-cationically, anionically, or radically polymerizable resin layer on a surface of the photopolymerizable resin layer. The anisotropic conductive film 100 of FIG. 5 can be obtained by performing the steps (AA) to (DD) after this step (a). At the step (AA), the conductive particles are arranged in a single layer on another surface of the photopolymerizable resin layer. In this case, it is preferable that the polymerization initiator used for formation of the second connection layer be a thermal polymerization initiator. Use of a photopolymerization initiator may affect the product life of the anisotropic conductive film, connection, and the stability of a connection structure in terms of the steps.

<<Production Method of Anisotropic Conductive Film of Second Aspect of the Present Invention>>

A production method of the anisotropic conductive film of the second aspect of the present invention includes a production method that performs a photopolymerization reaction in a single step and a production method that performs a photopolymerization reaction in two steps, similarly to the production method of the anisotropic conductive film of the first aspect.

<Production Method that Performs Photopolymerization Reaction in Single Step>

One example in which the anisotropic conductive film of FIG. 10 (FIG. 13B) is produced by photo-polymerization in a single step will be described. This production example includes the following steps (A') to (C').

(Step (A'))

Figure 11:
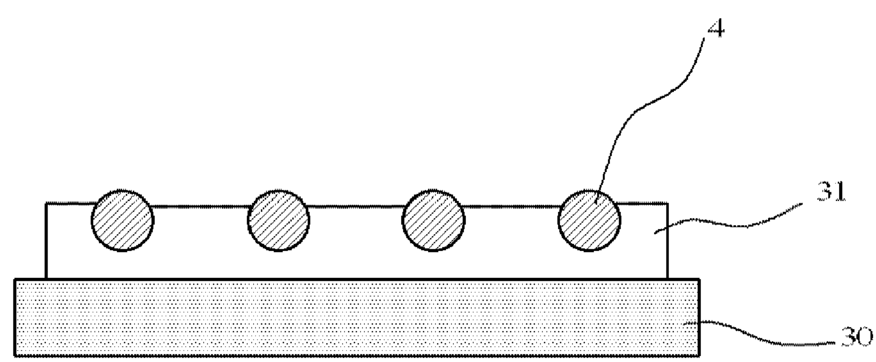
FIG. 11 is an explanatory diagram of a production step (A') of the anisotropic conductive film of the second aspect of the present invention.

As shown in FIG. 11, the conductive particles 4 are arranged in a single layer on a photopolymerizable resin layer 31 that is formed on a release film 30, if necessary. A procedure of arranging the conductive particles 4 is not particularly limited. A method for an unstretched polypropylene film in Example 1 of Japanese Patent No. 4789738 using a biaxial stretching operation, a method using a mold in Japanese Patent Application Laid-Open No. 2010-33793, or other methods may be used. For a degree of arrangement, the size, conduction reliability, insulating properties, and mounting conductive particle capture ratio of a connection subject are taken in account, and the conductive particles are preferably arranged so as to be two-dimensionally apart about 1 to about 100 μm from each other.

(Step (B'))

Figure 12A:
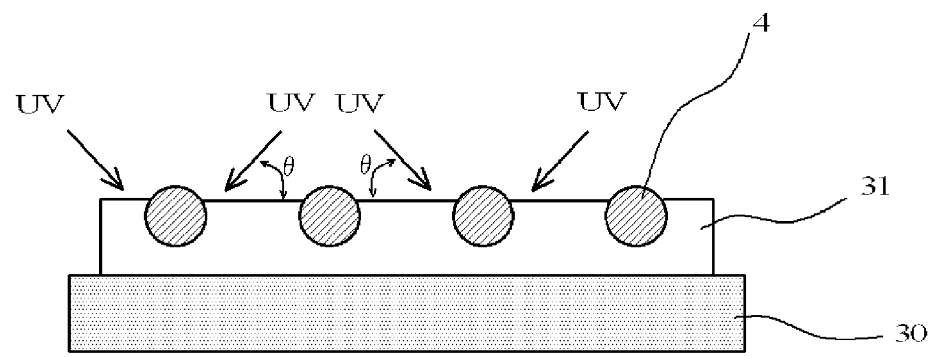
FIG. 12A is an explanatory diagram of a production step (B') of the anisotropic conductive film of the second aspect of the present invention.
Figure 12B:
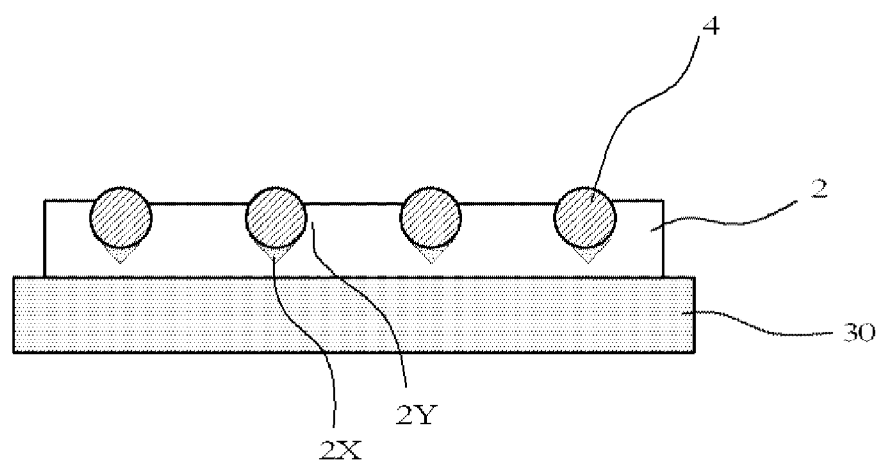
FIG. 12B is an explanatory diagram of the production step (B') of the anisotropic conductive film of the second aspect of the present invention.

As shown in FIG. 12A, the photopolymerizable resin layer 31 having the arranged conductive particles 4 is irradiated with inclined ultraviolet light (UV) in at least two direction using an LED light source and the like to cause a photopolymerization reaction, and the first connection layer 2 in which the conductive particles 4 are fixed in the surface is thus formed. In this manner, the curing ratio in the region 2X (in other words, the region of the first connection layer on the back side of the conductive particles) of the first connection layer between the conductive particles 4 and the outermost surface of the first connection layer 2 can be made lower than that in the region 2Y of the first connection layer between the adjacent conductive particles 4, as shown in FIG. 12B. In other words, in the first connection layer 2, the curing ratio in a region (the region 2X of the first connection layer) that is relatively near another surface (the outermost surface 2*b*) of the first connection layer 2 among regions of the first connection layer 2 in the vicinity of the conductive particles be made lower than that in the region 2Y of the first connection layer 2 on the side of the second connection layer. Thus, the curing ratio in the region of the first connection layer on the back side of the conductive particles surely decreases to facilitate pushing during bonding. In addition, the flow of the conductive particles can be prevented.

The "inclined in at least two directions" means directions that intersect each other, and directions that may not be in the same plane. In a case of the two directions, it is preferable that ultraviolet light be inclined line-symmetrically within a plane perpendicular to the photopolymerizable resin layer 31. The inclination angle $\theta$ is preferably $0^\circ<\theta\leq 90^\circ$, and more preferably $30^\circ\ \theta\leq 60^\circ$ with respect to the photopolymerizable resin layer 31. A plurality of directions preferably have the same inclination angle, but may have different inclination angles. For example, one inclination angle $\theta$ is 30° and another inclination angle $\theta$ is 60°, or one inclination angle $\theta$ is 90° and another inclination angle $\theta$ is 30°. Thus, when the photopolymerizable resin layer is irradiated with light inclined in two or more directions, the region 2X of the first connection layer that is a region in which the curing ratio is relatively low can be localized at a region on the back side of the conductive particles. When an inclination angle between two directions is made asymmetric, the position of the region 2X of the first connection layer can also be controlled.

(Step (C'))

Figure 13A:
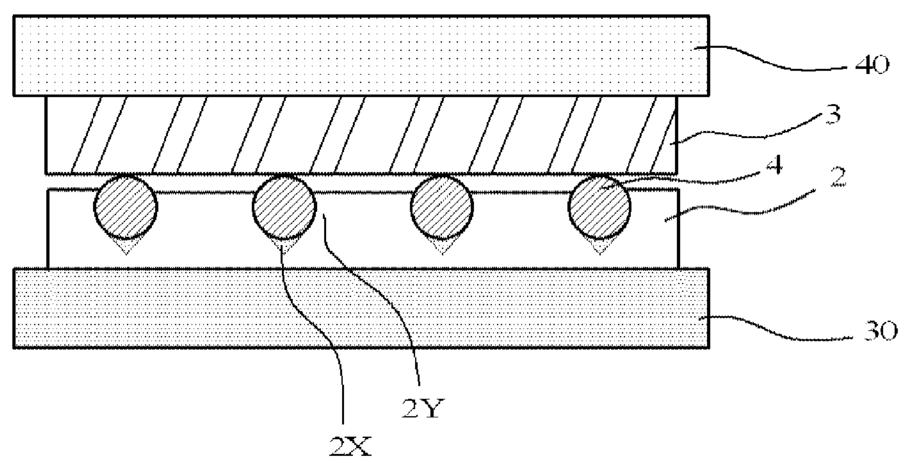
FIG. 13A is an explanatory diagram of a production step (C') of the anisotropic conductive film of the second aspect of the present invention.
Figure 13B:
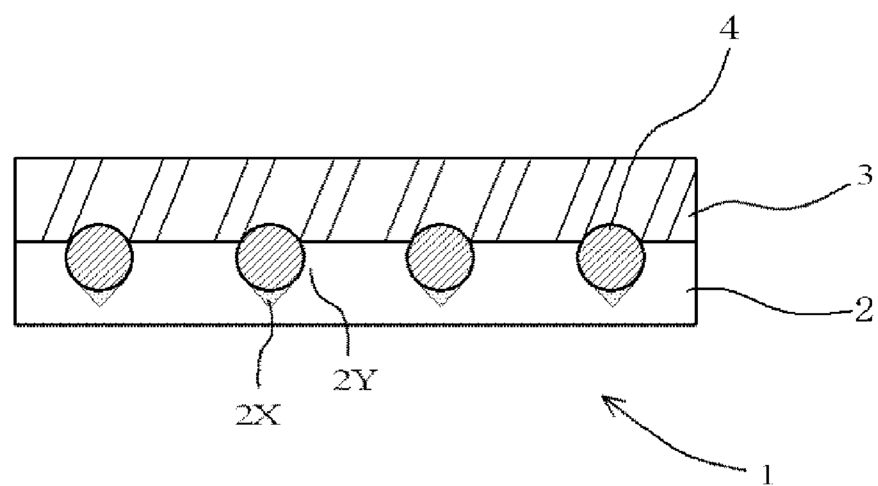
FIG. 13B is an explanatory diagram of the production step (C') of the anisotropic conductive film of the second aspect of the present invention.

As shown in FIG. 13A, the second connection layer 3 that includes a thermo- or photo-cationically, anionically, or radically polymerizable resin layer is formed on a surface of the first connection layer 2 on the side of the conductive particles 4. Specifically, the second connection layer 3 formed by an ordinary method on a release film 40 is disposed on the surface of the first connection layer 2 on the side of the conductive particles 4 and thermocompression-bonding is performed so as not to cause excessive thermal polymerization. The release films 30 and 40 are removed. Thus, the anisotropic conductive film of FIG. 13B can be obtained.

An anisotropic conductive film 100 of FIG. 14 can be obtained by performing the following step (Z) after the step (C'), similarly to the production method of the anisotropic conductive film of the first aspect of the present invention.

(Step (Z))

The third connection layer that includes a thermo- or photo-cationically, anionically, or radically polymerizable resin layer is formed on a surface of the first connection layer opposite to the conductive particles, preferably like the second connection layer. Thus, the anisotropic conductive film of FIG. 14 can be obtained.

The anisotropic conductive film 100 of FIG. 14 can also be obtained by performing the following step (a) before the step (A') without performing the step (Z) as in the production method of the anisotropic conductive film of the first aspect of the present invention.

(Step (a))

This step is a step of forming the third connection layer that includes a thermo- or photo-cationically, anionically, or radically polymerizable resin layer on a surface of the photopolymerizable resin layer. After this step (a), the anisotropic conductive film 100 of FIG. 14 can be obtained by performing the steps (A'), (B'), and (C'). At the step (A'), however, the conductive particles are arranged in a single layer on another surface of the photopolymerizable resin layer.

(Production Method that Performs Photopolymerization Reaction in Two Steps)

One example in which the anisotropic conductive film of FIG. 10 (FIG. 13B) is produced by photo-polymerization in two steps will be described. This production example includes the following steps (AA') to (DD').

(Step (AA'))

Figure 15:
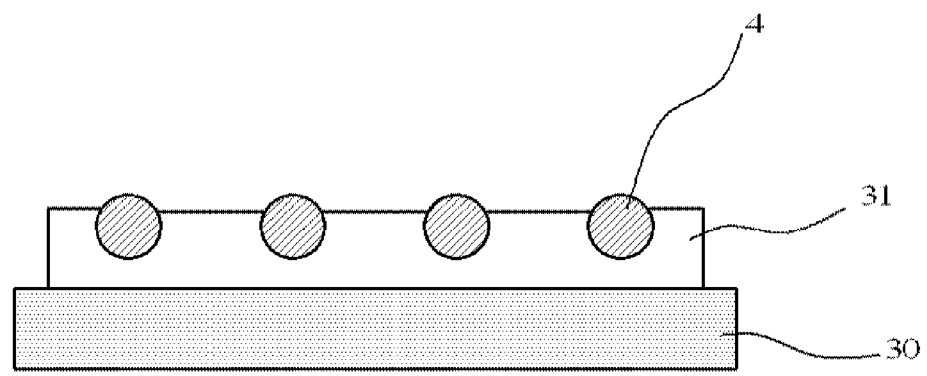
FIG. 15 is an explanatory diagram of a production step (AA') of the anisotropic conductive film of the second aspect of the present invention.

As shown in FIG. 15, the conductive particles 4 are arranged in a single layer on the photopolymerizable resin layer 31 that is formed on the release film 30, if necessary. A procedure of arranging the conductive particles 4 is not particularly limited. The method using a biaxial stretching operation for an unstretched polypropylene film in Example 1 of Japanese Patent No. 4789738, the method using a mold in Japanese Patent Application Laid-Open No. 2010-33793, or other methods may be used. For the degree of arrangement, the size, conduction reliability, insulating properties, and mounting conductive particle capture ratio of a connection subject are taken in account. The conductive particles are preferably arranged so as to be two-dimensionally apart about 1 to about 100 μm from each other.

(Step (BB'))

Figure 16A:
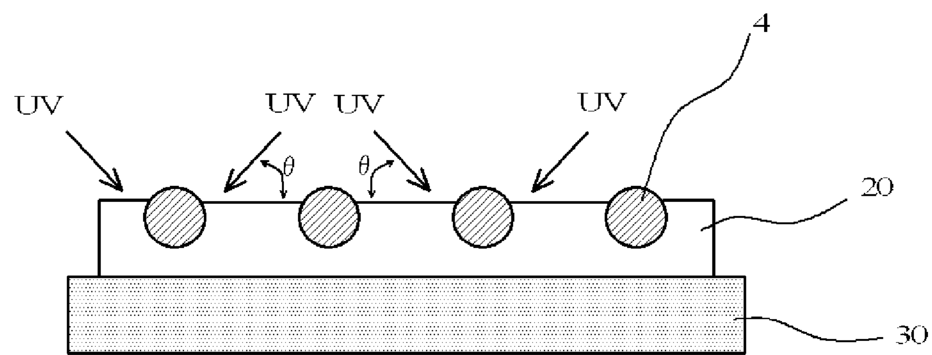
FIG. 16A is an explanatory diagram of a production step (BB') of the anisotropic conductive film of the second aspect of the present invention.
Figure 16B:
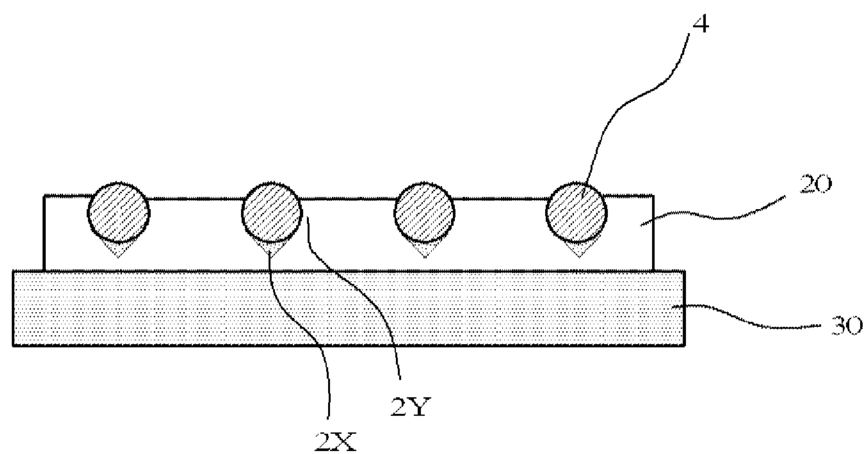
FIG. 16B is an explanatory diagram of the production step (BB') of the anisotropic conductive film of the second aspect of the present invention.

As shown in FIG. 16A, the photopolymerizable resin layer 31 having the arranged conductive particles 4 is irradiated with ultraviolet light (UV) inclined in at least two directions to cause a photopolymerization reaction, so that a first temporary connection layer 20 in which the conductive particles 4 are temporarily fixed on the surface is formed. In this manner, the curing ratio in the region 2X of the first temporary connection layer between the conductive particles 4 and the outermost surface of the first temporary connection layer 20 can be made lower than that in the region 2Y of the first temporary connection layer between the adjacent conductive particles 4, as shown in FIG. 16B. In other words, in the first connection layer 20, the curing ratio in a region (the region 2X of the first temporary connection layer) that is relatively near another surface (the outermost surface 2*b*) of the first temporary connection layer 20 among regions of the first temporary connection layer 20 in the vicinity of the conductive particles can be made lower than that of the surface of the first temporary connection layer 20 (the surface on the side of the second connection layer) (the region 2Y of the first temporary connection layer).

(Step (CC'))

Figure 17A:
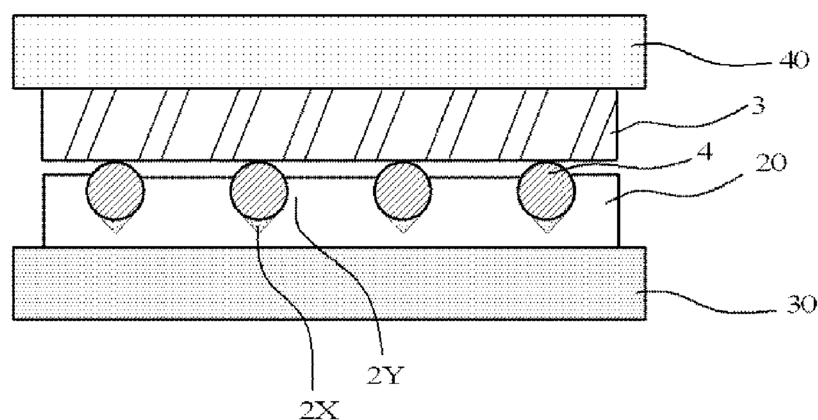
FIG. 17A is an explanatory diagram of a production step (CC') of the anisotropic conductive film of the second aspect of the present invention.
Figure 17B:
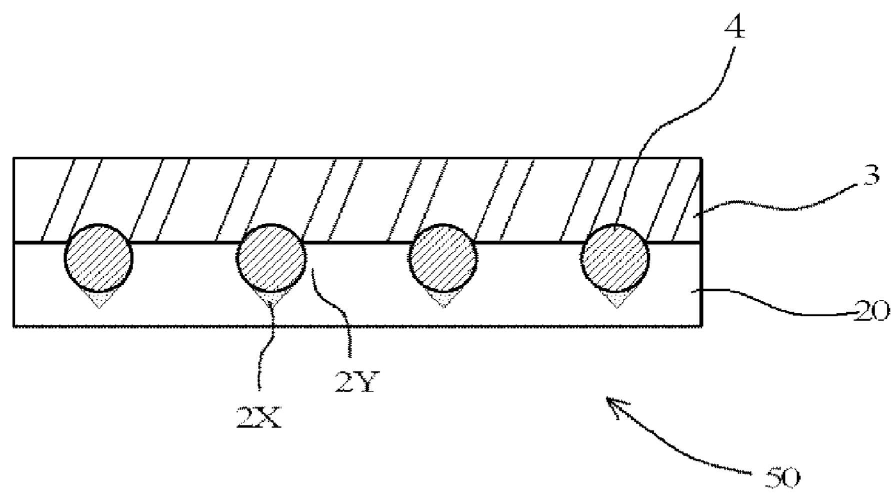
FIG. 17B is an explanatory diagram of the production step (CC') of the anisotropic conductive film of the second aspect of the present invention.

As shown in FIG. 17A, the second connection layer 3 that includes a thermo-cationically, anionically, or radically polymerizable resin layer is formed on a surface of the first temporary connection layer 20 on a side of the conductive particles 4. Specifically, the second connection layer 3 formed by an ordinary method on the release film 40 is disposed on the surface of the first connection layer 2 on the side of the conductive particles 4 and thermocompression-bonding is performed so as not to cause excessive thermal polymerization. The release films 30 and 40 are removed. Thus, a temporary anisotropic conductive film 50 of FIG. 17B can be obtained.

(Step (DD'))

Figure 18A:
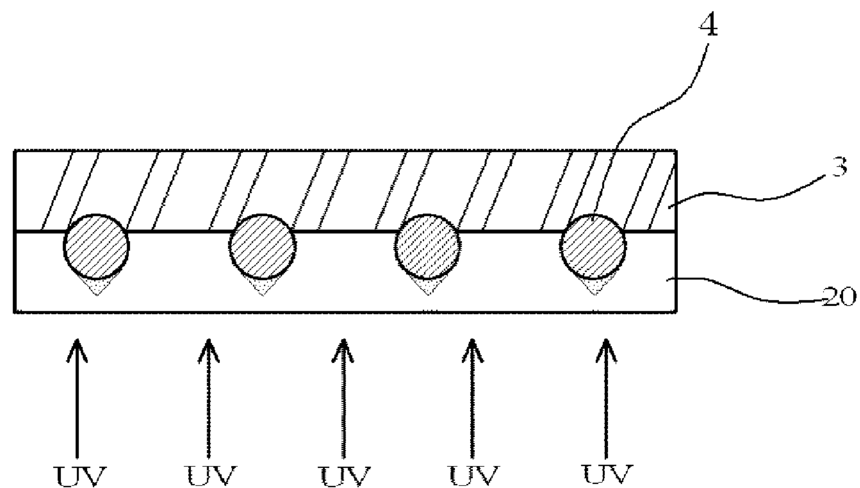
FIG. 18A is an explanatory diagram of a production step (DD') of the anisotropic conductive film of the second aspect of the present invention.
Figure 18B:
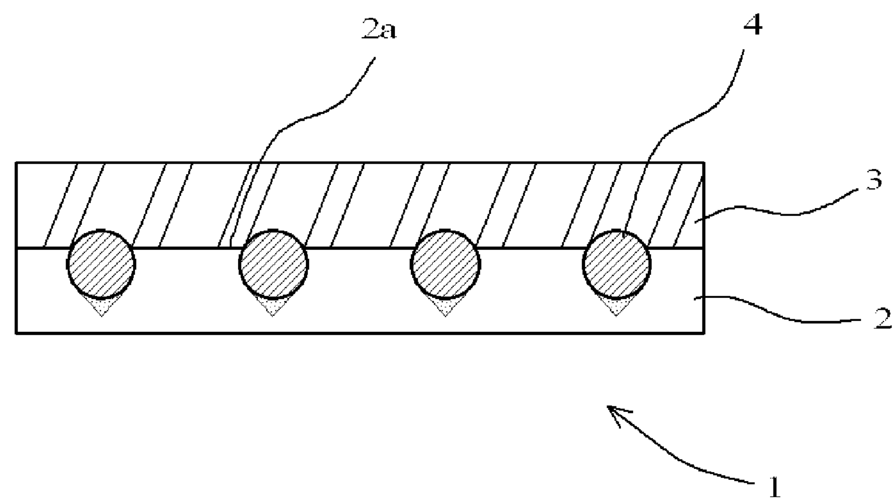
FIG. 18B is an explanatory diagram of the production step (DD') of the anisotropic conductive film of the second aspect of the present invention.

As shown in FIG. 18A, the first temporary connection layer 20 is irradiated with ultraviolet light from the side opposite to the second connection layer 3 using an LED light source and the like to cause a photopolymerization reaction, so that the first temporary connection layer 20 is fully cured to form the first connection layer 2. Thus, an anisotropic conductive film 1 of FIG. 18B can be obtained. At this step, it is preferable that the first temporary connection layer 20 be irradiated with ultraviolet light in a direction perpendicular to the first temporary connection layer 20. In order not to eliminate a difference in curing ratio between the regions 2X and 2Y of the first connection layer, it is preferable that irradiation be performed through a mask or a difference in amount of irradiated light be produced by an irradiated portion.

When the photo-polymerization is caused in two steps, the anisotropic conductive film 100 of FIG. 14 can be obtained by performing the following step (Z) after the step (DD') as in the production method of the anisotropic conductive film of the first aspect of the present invention.

(Step (Z))

The third connection layer that includes a thermo- or photo-cationically, anionically, or radically polymerizable resin layer is formed on a surface of the first connection layer opposite to the conductive particles, preferably like the second connection layer. Thus, the anisotropic conductive film of FIG. 5 can be obtained.

The anisotropic conductive film 100 of FIG. 14 can be obtained by performing the following step (a) before the step (AA') without performing the step (Z) as in the production method of the anisotropic conductive film of the first aspect of the present invention.

(Step (a))

This step is a step of forming the third connection layer that includes a thermo- or photo-cationically, anionically, or radically polymerizable resin layer on a surface of the photopolymerizable resin layer. The anisotropic conductive film 100 of FIG. 14 can be obtained by performing the steps (AA') to (DD') after this step (a). At the step (AA'), the conductive particles are arranged in a single layer on another surface of the photopolymerizable resin layer. In this case, it is preferable that the polymerization initiator used for formation of the second connection layer be a thermal polymerization initiator. Use of a photopolymerization initiator may adversely affect the product life of the anisotropic conductive film, connection, and the stability of a connection structure in terms of the steps.

<<Connection Structure>>

The anisotropic conductive film of the present invention thus obtained can be preferably applied to anisotropic conductive connection between a first electronic component such as an IC chip and an IC module and a second electronic component such as a flexible substrate and a glass substrate. The resultant connection structure is also a part of the present invention. It is preferable that a surface of the anisotropic conductive film on the side of the first connection layer be disposed on a side of the second electronic component such as a flexible substrate and a surface of the anisotropic conductive film on the side of the second connection layer be disposed on a side of the first electronic component such as an IC chip since the conduction reliability is enhanced.

EXAMPLES

Hereinafter, the present invention will be described specifically by Examples.

Examples 1 to 3 and Comparative Example 1

Conductive particles were arranged in accordance with an operation of Example 1 of Japanese Patent No. 4789738 (uniform arrangement of conductive particles), and an anisotropic conductive film having a two-layer structure in which first and second connection layers were layered in accordance with a composition (parts by mass) of Table 1 was produced.

(First Connection Layer)

Specifically, an acrylate compound, a photo-radical polymerization initiator, and the like were mixed in ethyl acetate or toluene to prepare a mixed liquid having a solid content of 50% by mass. This mixed liquid was applied to a polyethylene terephthalate film having a thickness of 50 μm so as to have a dried thickness of 5 μm, and dried in an oven at 80° C. for 5 minutes, to form a photo-radically polymerizable resin layer that was a precursor of the first connection layer.

Conductive particles (Ni/Au-plated resin particles, AUL 704, SEKISUI CHEMICAL CO., LTD.) having an average particle diameter of 4 μm were then arranged at intervals of 4 μm in a single layer on the obtained photo-radically polymerizable resin layer. The photo-radically polymerizable resin layer was irradiated with ultraviolet light having a wavelength of 365 nm at an integrated light amount of 4,000 mJ/cm$^2$ from an LED light source from the side of the conductive particles at an angle described in Table 1 in a direction orthogonal to the longitudinal direction of the anisotropic conductive film. Thus, the first connection layer in which the conductive particles were fixed in the surface thereof was formed. In Comparative Example 1, the photo-radically polymerizable resin layer was irradiated with ultraviolet light from the side of the conductive particles at an angle of 90°.

(Second Connection Layer)

A thermosetting resin, a latent curing agent, and the like were mixed in ethyl acetate or toluene to prepare a mixed liquid having a solid content of 50% by mass. This mixed liquid was applied to a polyethylene terephthalate film having a thickness of 50 μm so as to have a dried thickness of 12 μm, and dried in an oven at 80° C. for 5 minutes, to form the second connection layer.

(Anisotropic Conductive Film)

The thus obtained first and second connection layers were laminated so that the conductive particles were located inside, to obtain the anisotropic conductive film.

(Connection Structure Sample)

An IC chip having a size of 0.5×1.8×20.0 mm (bump size: 30×85 μm, bump height: 15 μm, bump pitch: 50 μm) was temporarily attached to a glass wiring substrate (1737F) having a size of 0.5×50×30 mm available from Corning Incorporated using the obtained anisotropic conductive film under conditions of 50° C., 5 MPa, and 1 seconds, and then mounted thereon under conditions of 180° C., 80 MPa, and 5 seconds to obtain a connection structure sample.

(Test Evaluation)

As described below, "mounting conductive particle capture ratio," "directionality of conductive particles during anisotropic conductive connection," "initial conduction resistance," "conduction resistance after aging," and "short circuit occurrence ratio" in the obtained connection structure samples were tested and evaluated. The obtained results are shown in Table 1.

"Mounting Conductive Particle Capture Ratio"

The ratio of the amount of particles actually captured after heating and pressurization to the theoretical amount of particles existing on a bump of each of the connection structure samples before heating and pressurization during mounting was determined. The amount of particles was counted using an optical microscope. In practical terms, the ratio is desirably 50% or more.

"Directionality of Conductive Particles During Anisotropic Conductive Connection"

The conductive particles captured on the bump after anisotropic conductive connection were observed by an optical microscope. Acquisition of uniformity of flow directions due to inclination of LED was examined. 100 units of group of two or more conductive particles linked (a total of 200 particles) were counted. Among the groups, a group in which 70% or more of directions of the conductive particles are the same is taken as "uniform," and a group in which less than 70% thereof are the same is taken as "random."

"Initial Conduction Resistance"

The conduction resistance value of each of the connection structure samples was measured by a digital multimeter (Agilent Technologies).

"Conduction Resistance After Aging"

Each connection structure sample was left under a high temperature and high humidity environment of 85° C. and 85% RH for 500 hours. The conduction resistance was then measured by a digital multimeter (Agilent Technologies). In practical terms, the conduction resistance is desirably 4Ω or less.

"Short Circuit Occurrence Ratio"

The short circuit occurrence ratio of comb-teeth TEG pattern with a space of 7.5 μm was determined. A short circuit occurrence ratio of 100 ppm or less can be judged to exhibit favorable insulating properties in practical terms.

TABLE 1

| | | | | Example 1 | Example 2 | Example 3 | Comparative Example 1 |
|---|---|---|---|---|---|---|---|
| First Connection Layer | Phenoxy Resin | YP-50 | Nippon Steel & Sumikin Chemical Co., Ltd. | 60 | 80 | 60 | 60 |
| | Acrylate | EB600 | Daicel-Allnex Ltd. | 40 | 20 | 40 | 40 |
| | Photo-Radical Polymerization Initiator | IRGACURE 369 | BASF Japan Ltd. | 2 | 2 | 2 | 2 |
| | Thermal Cationic Polymerization Initiator | SI-60L | Sanshin Chemical Industry Co., Ltd | 2 | 2 | 2 | 2 |
| | Conductive Particle Arrangement | AUL704 | Sekisui Chemical Co., Ltd. | Uniform | Uniform | Uniform | Uniform |
| | UV Irradiation | Irradiation Angle | | 15° | 45° | 75° | 90° |
| Second Connection Layer | Phenoxy Resin | YP-50 | Nippon Steel & Sumikin Chemical Co., Ltd. | 60 | 60 | 60 | 60 |
| | Epoxy Resin | jER828 | Mitsubishi Chemical Corporation | 40 | 40 | 40 | 40 |
| | Thermal Cationic Polymerization Initiator | SI-60L | Sanshin Chemical Industry Co., Ltd | 2 | 2 | 2 | 2 |
| Mounting Particle Capture Ratio (%) | | | | 85 | 85 | 82 | 80 |
| Directionality of Conductive Particles during Anisotropic Conductive Connection | | | | Uniform | Uniform | Uniform | Random |
| Initial Conduction Resistance (Ω) | | | | 0.2 | 0.2 | 0.2 | 0.2 |
| Conduction Resistance After Aging (Ω) | | | | 4 | 4 | 4 | 4 |
| Short Circuit Occurrence Ratio (ppm) | | | | 20 | 20 | 20 | 50 |

As seen from Table 1, in the anisotropic conductive films of Examples 1 to 3, the mounting conductive particle capture ratio is slightly improved as compared with Comparative Example 1 and in addition, the flow directions of the conductive particles during anisotropic conductive connection can be made uniform. This is because irradiation with inclined UV was performed during production in Examples 1 to 3.
This results show that the short circuit occurrence ratio can be largely decreased as compared with Comparative Example.

Examples 4 to 9 and Comparative Examples 2 to 3

Conductive particles were arranged in accordance with the operation of Example 1 of Japanese Patent No. 4789738, and an anisotropic conductive film having a two-layer structure in which first and second connection layers were layered in accordance with a composition (parts by mass) of Table 1 was produced.
(First Connection Layer)

Specifically, an acrylate compound, a photo-radical polymerization initiator, and the like were mixed in ethyl acetate or toluene to prepare a mixed liquid having a solid content of 50% by mass. This mixed liquid was applied to a polyethylene terephthalate film having a thickness of 50 μm so as to have a dried thickness of 5 μm, and dried in an oven at 80° C. for 5 minutes, to form a photo-radically polymerizable resin layer that was a precursor of the first connection layer.

Conductive particles (Ni/Au-plated resin particles, AUL 704, SEKISUI CHEMICAL CO., LTD.) having an average particle diameter of 4 μm were then arranged at intervals of 4 μm in a single layer on the obtained photo-radically polymerizable resin layer. The photo-radically polymerizable resin layer was irradiated with ultraviolet light having a wavelength of 365 nm at an integrated light amount of 4,000 mJ/cm$^2$ from an LED light source from the side of the conductive particles in a direction and at an angle shown in Table 2. Thus, the first connection layer in which the conductive particles were fixed in the surface thereof was formed.

In Examples 4 to 6, the photo-radically polymerizable resin layer was irradiated with ultraviolet light from the side of the conductive particles in two directions which formed each angle of 60° within a perpendicular plane and an included angle of 60°. In Example 7, the photo-radically polymerizable resin layer was irradiated with ultraviolet light from the side of the conductive particles in two directions which formed angles of 60° and 30° within a perpendicular plane and an included angle of 90°. In Example 8, the photo-radically polymerizable resin layer was irradiated with ultraviolet light from the side of the conductive particles in two directions which formed angles of 90° and 30° within a perpendicular plane and an included angle of 60°. In Example 9, the photo-radically polymerizable resin layer was irradiated with ultraviolet light from the side of the conductive particles in two directions which formed angles of 90° and 60° within a perpendicular plane and an included angle of 30°. In Comparative Example 2, the photo-radically polymerizable resin layer was irradiated with ultraviolet light from the side of the back side of the photo-radically polymerizable resin layer (from the surface where the conductive particles were not arranged) at angle of 90°. In contrast, in Comparative Example 3, the photo-radically polymerizable resin layer was irradiated with ultraviolet light from the side of the conductive particles in one direction at 90°.
(Second Connection Layer)

A thermosetting resin, a latent curing agent, and the like were mixed in ethyl acetate or toluene to prepare a mixed liquid having a solid content of 50% by mass. This mixed liquid was applied to a polyethylene terephthalate film having a thickness of 50 μm so as to have a dried thickness of 12 μm, and dried in an oven at 80° C. for 5 minutes, to form the second connection layer.

(Anisotropic Conductive Film)

The thus obtained first and second connection layers were laminated so that the conductive particles were located inside, to obtain the anisotropic conductive film.

(Connection Structure Sample)

An IC chip having a size of 0.5×1.8×20.0 mm (bump size: 30×85 μm, bump height: 15 μm, bump pitch: 50 μm) was temporarily attached to a glass wiring substrate (1737F) having a size of 0.5×50×30 mm available from Corning Incorporated using the obtained anisotropic conductive film under conditions of 50° C., 5 MPa, and 1 seconds, and then mounted thereon under conditions of 180° C., 80 MPa, and 5 seconds to obtain a connection structure sample.

temporary attachment was counted using an optical microscope. The number of the conductive particles existing on the same outer edge after mounting was counted. The ratio of the number of the conductive particles after mounting to the number of the conductive particles during temporary attachment was determined.

"Average Distance Between Conductive Particles within Bump Plane (μm)"

For 100 conductive particles within a bump plane of each of the connection structure samples, the distance between the conductive particles was measured using an optical microscope. The arithmetic average of the measurement results was determined as an average distance between the conductive particles.

TABLE 2

| | | | | Example | | | | | | Comparative Example | |
|---|---|---|---|---|---|---|---|---|---|---|---|
| | | | | 4 | 5 | 6 | 7 | 8 | 9 | 2 | 3 |
| First Connection Layer | Phenoxy Resin | YP-50 | Nippon Steel & Sumikin Chemical Co., Ltd. | 60 | 80 | 60 | 60 | 60 | 60 | 60 | 60 |
| | Acrylate | EB600 | Daicel-Allnex Ltd. | 40 | 20 | 40 | 40 | 40 | 40 | 40 | 40 |
| | Photo-Radical Polymerization Initiator | IRGACURE 369 | BASF Japan Ltd. | 2 | 2 | 2 | 2 | 2 | 2 | 2 | 2 |
| | Thermal Cationic Polymerization Initiator | SI-60L | Sanshin Chemical Industry Co., Ltd. | 2 | 2 | 2 | 2 | 2 | 2 | 2 | 2 |
| | Conductive Particle Arrangement | AUL704 | Sekisui Chemical Co., Ltd. | Uniform | Uniform | Uniform | Uniform | Uniform | Uniform | Uniform | Uniform |
| UV Irradiation | | Direction | | 2 | 2 | 2 | 2 | 2 | 2 | 1 | 1 |
| | | Irradiation Angle (°) | | 60, 60 | 45, 45 | 30, 30 | 60, 30 | 90, 30 | 90, 60 | (Back Side) | 90° |
| Second Connection Layer | Phenoxy Resin | YP-50 | Nippon Steel & Sumikin Chemical Co., Ltd. | 60 | 60 | 60 | 60 | 60 | 60 | 60 | 60 |
| | Epoxy Resin | jER828 | Mitsubishi Chemical Corporation | 40 | 40 | 40 | 40 | 40 | 40 | 40 | 40 |
| | Thermal Cationic Polymerization Initiator | SI-60L | Sanshin Chemical Industry Co., Ltd. | 2 | 2 | 2 | 2 | 2 | 2 | 2 | 2 |
| Thickness Ratio at Which Curing Ratio of First Connection Layer is 90% or more (%) | | | | 20 | 50 | 90 | 90 | 90 | 20 | 100 | Less than 10 |
| Ratio of Conductive Particles Disposed on Bump Edge (%) | | | | 90 | 80 | 70 | 75 | 75 | 90 | 50 | 60 |
| Average Distance between Conductive Particles within Bump Plane (μm) | | | | 4.1 | 4.3 | 4.7 | 4.5 | 4.5 | 4.1 | 4.1 | 5 |

(Test Evaluation)

In order to examine behavior of the conductive particles within the bump plane during connection in the obtained connection structure samples, "thickness ratio (%) at which curing ratio of first connection layer is 90% or more," "ratio (%) of conductive particles disposed on bump edge," and "average distance between conductive particles within bump plane (μm)" were examined as described below. The obtained results are shown in Table 2.

"Thickness Ratio (%) at which Curing Ratio of First Connection Layer is 90% or More"

A cross section of the first connection layer was exposed from each of the connection structure samples by cross section polishing. The presence or absence of vinyl group in the vicinity of the exposed conductive particles was determined by IR. The ratio of thickness of a region in which the curing ratio was 90% or more relative to the whole thickness was determined.

"Ratio (%) of Conductive Particles Disposed on Bump Edge"

During the formation of the connection structure samples, the number of the conductive particles on the edge (outer edge with a width of 6 μm of the bump) of the bump during As seen from Table 2, in the anisotropic conductive films of Examples 4 to 9, the ratio of thickness at which the curing ratio in a region under a region of the first connection layer in the vicinity of the conductive particles (in a direction of surface of the first connection layer opposite to the second connection layer) is 90% or more is 20 to 90%. Therefore, the conductive particles can be favorably pushed so that shift of positions of the conductive particles during mounting does not occur, that is, while movement of the conductive particles in a plane direction is suppressed. As a result, the distance between the conductive particles on the bump hardly changes, and a ratio at which the conductive particles flow from the bump edge to the outside of the bump largely decreases. Accordingly, this shows that favorable conduction reliability, favorable insulating properties, and favorable mounting conductive particle capture ratio can be achieved.

In contract, in the anisotropic conductive film of Comparative Example 2, the whole first connection layer has a curing ratio of 90% or more. Therefore, the conductive particles cannot be favorably pushed while movement of the conductive particles in a plane direction is suppressed. As a result, the distance between the conductive particles on the bump increases, and a ratio at which the conductive particles flow from the bump edge to the outside of the bump largely increases. In the anisotropic conductive film of Comparative Example 3, the photo-radically polymerizable resin layer was irradiated with ultraviolet light from the side of the conductive particles in one direction of 90° (perpendicular direction), not irradiated with ultraviolet light in two directions. Therefore, a ratio at which the curing ratio is 90% or more under the conductive particles is as too small as less than 10%. As compared with Examples 4 to 6, the conductive particles cannot be favorably pushed while movement of the conductive particles in a plane direction is suppressed. As a result, the distance between the conductive particles on the bump increases, and a ratio at which the conductive particles flow from the bump edge to the outside of the bump largely increases.

INDUSTRIAL APPLICABILITY

The anisotropic conductive film of the first aspect of the present invention has a two-layer structure in which the first connection layer that is obtained by photo-radically polymerizing a photo-radically polymerizable resin layer and the second connection layer that includes a thermo- or photo-cationically or anionically polymerizable resin layer, or preferably a thermo- or photo-radically polymerizable resin layer containing an acrylate compound and a thermal or photo-radical polymerization initiator are layered. In addition, the conductive particles for anisotropic conductive connection are arranged in a single layer on a surface of the first connection layer on the side of the second connection layer. Further, a region in which the curing ratio is lower than that of the surface of the first connection layer (the surface on the side of the second connection layer) exists in a direction oblique to the thickness direction of the first connection layer. For this reason, the flow directions of the conductive particles can be made uniform during anisotropic conductive connection. Therefore, favorable conduction reliability, insulating properties, and mounting conductive particle capture ratio are exhibited.

The anisotropic conductive film of the second aspect of the present invention has a two-layer structure in which the first connection layer that is a photopolymerized resin layer and the second connection layer that is a thermo- or photo-cationically, anionically, or radically polymerizable resin layer are layered. In addition, the conductive particles for anisotropic conductive connection are arranged in a single layer on a surface of the first connection layer on the side of the second connection layer. Further, the curing ratio in a region that is relatively near another surface of the first connection layer among regions of the first connection layer in the vicinity of the conductive particles is lower than that of the surface of the first connection layer (the surface on the side of the second connection layer). For this reason, favorable conduction reliability, insulating properties, and mounting conductive particle capture ratio are exhibited. Therefore, the anisotropic conductive film is useful in anisotropic conductive connection of an electronic component such as an IC chip to a wiring substrate. The width of the wiring of such an electronic component has been decreased. When the present invention contributes to such technical advancement, the effects are particularly exerted.

REFERENCE SIGNS LIST

- 1, 100 anisotropic conductive film
- 2 first connection layer
- 2*a* surface of first connection layer on the side of second connection layer
- 2*b* outermost surface of second connection layer
- 2X, 2Y region of first (temporary) connection layer
- 3 second connection layer
- 4 conductive particle
- 5 third connection layer
- 30, 40 release film
- 20 first temporary connection layer
- 31 photopolymerizable resin layer
- 50 temporary anisotropic conductive film

The invention claimed is:

1. An anisotropic conductive film comprising a first connection layer and a second connection layer formed on a surface of the first connection layer, wherein the first connection layer is a photopolymerized resin layer, the second connection layer is a thermo- or photo-cationically, anionically, or radically polymerizable resin layer, and conductive particles for anisotropic conductive connection are arranged in a single layer on the surface of the first connection layer, wherein the first connection layer includes an oblique region in which a curing ratio is lower than that of the surface of the first connection layer and exists in a direction oblique to a thickness direction of the first connection layer, and a second region having an interface with the oblique region, the interface is oblique to the surface of the first connection layer, and the curing ratio of the oblique region is made lower than the second region.

2. The anisotropic conductive film according to claim 1, wherein the first connection layer is a photo-radically polymerized resin layer obtained by photo-radically polymerizing a photo-radically polymerizable resin layer containing an acrylate compound and a photo-radical polymerization initiator.

3. The anisotropic conductive film according to claim 2, wherein the first connection layer further contains an epoxy compound and a thermo- or photo-cationic or anionic polymerization initiator.

4. The anisotropic conductive film according to claim 1, wherein the second connection layer is a thermo- or photo-cationically or anionically polymerizable resin layer containing an epoxy compound and a thermo- or photo-cationic or anionic polymerization initiator or a thermo- or photo-radically polymerizable resin layer containing an acrylate compound and a thermo- or photo-radical polymerization initiator.

5. The anisotropic conductive film according to claim 4, wherein the second connection layer is a thermo- or photo-cationically or anionically polymerizable resin layer containing an epoxy compound and a thermo- or photo-cationic or anionic polymerization initiator and further contains an acrylate compound and a thermo- or photo-radical polymerization initiator.

6. The anisotropic conductive film according to claim 1, wherein the conductive particles extend into the second connection layer.

7. The anisotropic conductive film according to claim 1, wherein a lowest melt viscosity of the first connection layer is higher than a lowest melt viscosity of the second connection layer.

8. A production method of the anisotropic conductive film according to claim 1, comprising the following steps (A) to (C):

Step (A) a step of arranging conductive particles in a single layer on a photopolymerizable resin layer;

Step (B) a step of irradiating the photopolymerizable resin layer having the arranged conductive particles with inclined ultraviolet light to cause a photopolymerization reaction, to thereby form the first connection layer in which the conductive particles are fixed in a surface thereof; and Step (C) a step of forming the second connection layer that includes a thermo- or photo-cationically or anionically polymerizable resin layer, or a thermo- or photo-radically polymerizable resin layer on the surface of the first connection layer on a side of the conductive particles.

9. The production method according to claim 8, wherein the step (B) of irradiating with ultraviolet light is performed from the surface where the conductive particles are arranged in the photopolymerizable resin layer.

10. A production method of the anisotropic conductive film according to claim 1, comprising the following steps (AA) to (DD):

Step (AA) a step of arranging conductive particles in a single layer on a photopolymerizable resin layer;

Step (BB) a step of irradiating the photopolymerizable resin layer having the arranged conductive particles with inclined ultraviolet light to cause a photopolymerization reaction, to thereby form a first temporary connection layer in which the conductive particles are temporarily fixed on a surface thereof;

Step (CC) a step of forming the second connection layer that includes a thermo-cationically, anionically, or radically polymerizable resin layer on the surface of the first temporary connection layer on a side of the conductive particles; and Step (DD) a step of irradiating the first temporary connection layer with ultraviolet light from a side opposite to the second connection layer to cause a photopolymerization reaction, to thereby cure the first temporary connection layer to form the first connection layer.

11. The production method according to claim 10, wherein the step (BB) of irradiating with ultraviolet light is performed from the surface where the conductive particles are arranged in the photopolymerizable resin layer.

12. The production method according to claim 8, comprising, after the step (C), the following step (Z):

Step (Z) a step of forming a third connection layer that includes a thermo- or photo-cationically, anionically, or radically polymerizable resin layer on a surface of the first connection layer opposite to the conductive particles.

13. The production method according to claim 8, comprising, before the step (A), the following step (a):

Step (a) a step of forming a third connection layer that includes a thermo- or photo-cationically, anionically, or radically polymerizable resin layer on a surface of the photopolymerizable resin layer, and wherein in the step (A), the conductive particles are arranged in a single layer on another surface of the photopolymerizable resin layer.

14. The production method according to claim 10, comprising, after the step (DD), the following step (Z):

Step (Z)

a step of forming a third connection layer that includes a thermo- or photo-cationically, anionically, or radically polymerizable resin layer on a surface of the first connection layer opposite to the conductive particles.

15. The production method according to claim 10, comprising, before the step (AA), the following step (a):

Step (a)

a step of forming a third connection layer that includes a thermo- or photo-cationically, anionically, or radically polymerizable resin layer on a surface of the photopolymerizable resin layer, and wherein in the step (AA), the conductive particles are arranged in a single layer on another surface of the photopolymerizable resin layer.

16. A connection structure in which a first electronic component and a second electronic component are connected by anisotropic conduction through the anisotropic conductive film according to claim 1.

* * * * *